US009325362B2

(12) United States Patent
Umeda et al.

(10) Patent No.: US 9,325,362 B2
(45) Date of Patent: Apr. 26, 2016

(54) RECTIFICATION CIRCUIT AND WIRELESS COMMUNICATION APPARATUS USING THE SAME

(71) Applicant: Kabushiki Kaisha Toshiba, Minato-ku (JP)

(72) Inventors: Toshiyuki Umeda, Inagi (JP); Shoji Otaka, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 196 days.

(21) Appl. No.: 13/973,226

(22) Filed: Aug. 22, 2013

(65) Prior Publication Data
US 2014/0093016 A1 Apr. 3, 2014

(30) Foreign Application Priority Data

Sep. 28, 2012 (JP) ................................. 2012-218785

(51) Int. Cl.
| H03M 5/02 | (2006.01) |
| H04B 1/18 | (2006.01) |
| H02M 1/088 | (2006.01) |
| H02J 5/00 | (2016.01) |
| H03K 17/30 | (2006.01) |

(52) U.S. Cl.
CPC . *H04B 1/18* (2013.01); *H02J 5/005* (2013.01); *H02M 1/088* (2013.01); *H03K 17/302* (2013.01); *H03K 2017/307* (2013.01)

(58) Field of Classification Search
CPC ............. H01L 2924/1306; H01L 2924/13091; H01L 2924/1305; H04W 52/028; G06K 19/0707; H03M 5/02

USPC .......................................... 375/320, 340, 353
See application file for complete search history.

(56) References Cited

U.S. PATENT DOCUMENTS

| 4,031,481 | A | | 6/1977 | Yoshida | |
| 4,360,789 | A | * | 11/1982 | Lewyn | ................... H03B 5/364 331/109 |
| 4,455,628 | A | | 6/1984 | Ozaki et al. | |
| 5,173,849 | A | | 12/1992 | Brooks | |
| 5,341,340 | A | * | 8/1994 | Hagura | .......................... 365/226 |

(Continued)

FOREIGN PATENT DOCUMENTS

| EP | 0 840 452 A1 | 5/1998 |
| JP | 2-29022 | 1/1990 |

(Continued)

OTHER PUBLICATIONS

Office Action issued Aug. 1, 2014 in Japanese Patent Application No. 2012-218785 (with partial English translation).

(Continued)

*Primary Examiner* — Emmanuel Bayard
(74) *Attorney, Agent, or Firm* — Oblon, McClelland, Maier & Neustadt, L.L.P.

(57) ABSTRACT

A rectification circuit includes a first field-effect transistor and a bias voltage generation circuit. The field-effect transistor includes a first gate terminal, a first source terminal, a first source region having a first p-type diffusion layer and connected to the first source terminal, a first drain terminal, and a first drain region having a first n-type diffusion layer and connected to the first drain terminal. The bias voltage generation circuit is configured to apply a DC voltage between the first gate terminal and the first drain terminal.

15 Claims, 30 Drawing Sheets

(56) References Cited

U.S. PATENT DOCUMENTS

| | | | |
|---|---|---|---|
| 5,394,359 | A | 2/1995 | Kowalski |
| 6,489,796 | B2 | 12/2002 | Tomishima |
| 7,048,196 | B2 * | 5/2006 | Arisawa ................ 235/492 |
| 7,391,278 | B2 * | 6/2008 | Berens ................ 331/116 R |
| 7,424,265 | B2 * | 9/2008 | Umeda et al. ........... 455/41.1 |
| 7,840,181 | B2 * | 11/2010 | Umeda et al. ........... 455/41.1 |
| 7,889,528 | B2 * | 2/2011 | Shionoiri .............. 363/125 |
| 7,890,054 | B2 * | 2/2011 | Umeda et al. ........... 455/41.1 |
| 7,904,121 | B2 * | 3/2011 | Umeda et al. ........... 455/572 |
| 2002/0118557 | A1 | 8/2002 | Ohlsson |
| 2003/0021158 | A1 | 1/2003 | Gomez |
| 2005/0052287 | A1 | 3/2005 | Whitesmith et al. |
| 2009/0132836 | A1 * | 5/2009 | Mera et al. ............. 713/310 |
| 2011/0241113 | A1 * | 10/2011 | Zuniga ................ 257/343 |
| 2013/0249676 | A1 | 9/2013 | Umeda et al. |

FOREIGN PATENT DOCUMENTS

| | | |
|---|---|---|
| JP | 5-190847 | 7/1993 |
| JP | 5-211772 | 8/1993 |
| JP | 10-254563 | 9/1998 |
| JP | 2001-166837 | 6/2001 |
| JP | 2002-15574 | 1/2002 |
| JP | 2002-152080 | 5/2002 |
| JP | 2002-261273 | 9/2002 |
| JP | 2003-6777 | 1/2003 |
| JP | 2006-34085 | 2/2006 |
| WO | WO 2004/040658 A1 | 5/2004 |
| WO | WO 2011/121663 A1 | 10/2011 |

OTHER PUBLICATIONS

Office Action issued on Feb. 27, 2015 in the corresponding Japanese Patent Application No. 2012-218785 (with partial English translation).

Hamid Reza Mehrvarz et al. "A Pseudologarithmic Rectifier Using Unbalanced Bias MFMOS Differential Pairs", IEEE Journal of Solid-State Circuits, vol. 33, No. 1, Jan. 1998, pp. 28-35.

Mitsuo Usami et al. "Powder LSI: An Ultra Small RF Identification Chip for Individual Recognition Applications", ISSCC 2003/ Session 22/ TD: Embedded Technologies/ Paper 22.7, 2003, 10 pages.

Office Action mailed Jan. 18, 2016 in Japanese Application No. 2015-088785 (w/English translation).

* cited by examiner

FIG. 12A
FIG. 12B
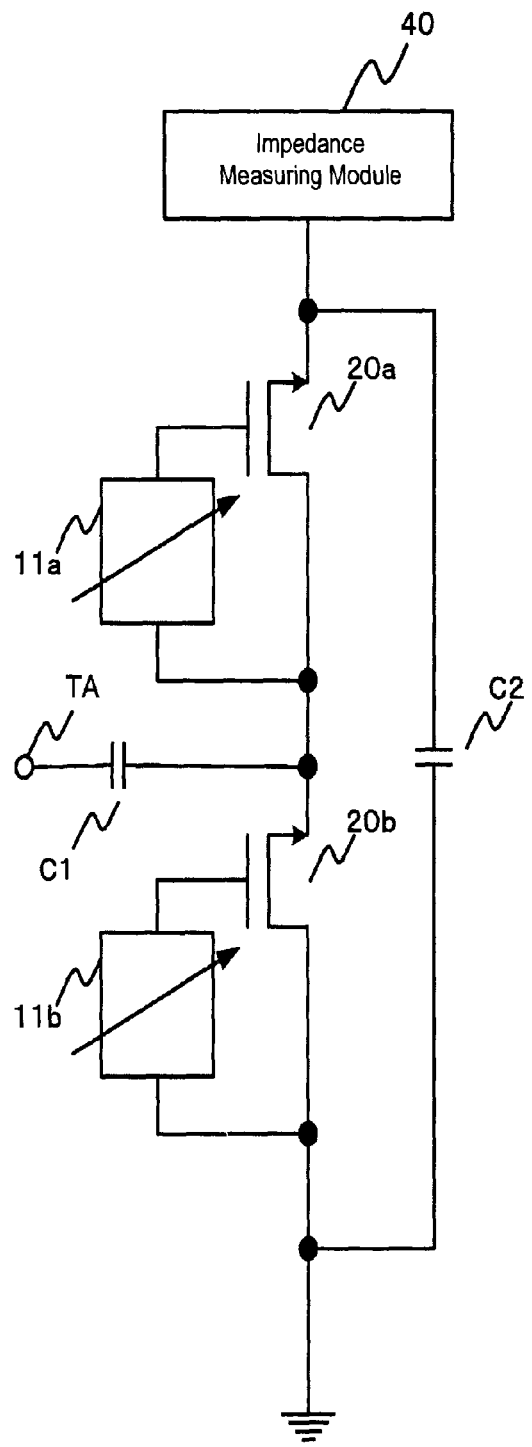
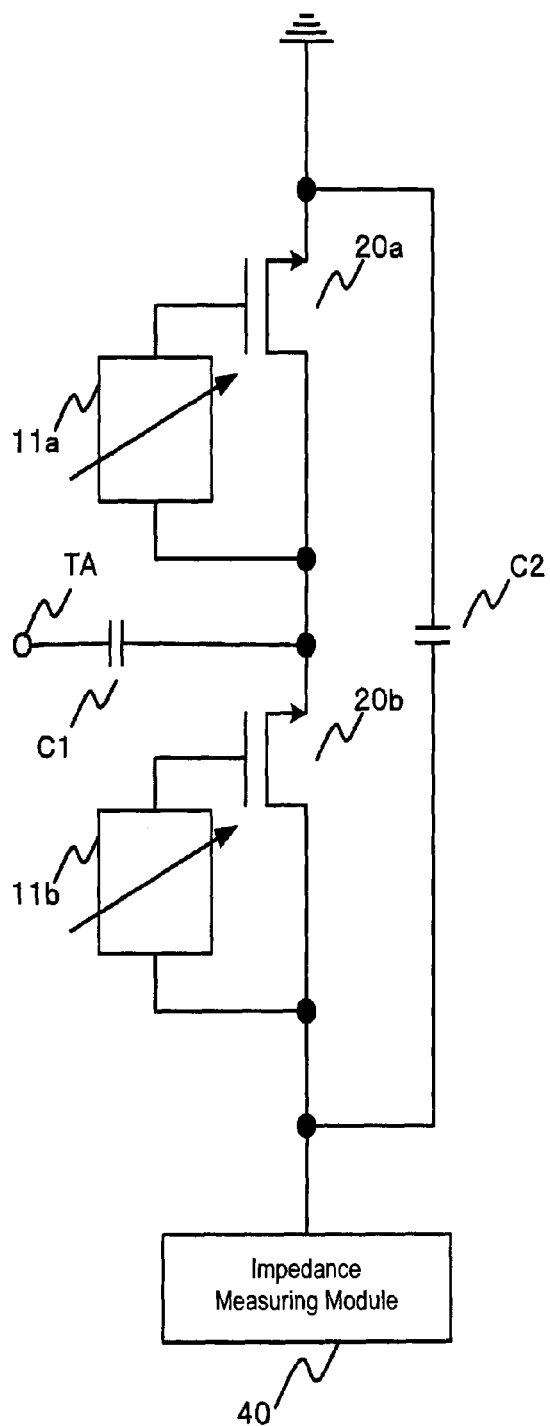

RECTIFICATION CIRCUIT AND WIRELESS COMMUNICATION APPARATUS USING THE SAME

CROSS-REFERENCE TO RELATED APPLICATION(S)

The present disclosure claims priority to Japanese Patent Application No. 2012-218785, filed on Sep. 28, 2012, which is incorporated herein by reference in its entirety.

FIELD

Embodiments described herein relate generally to a rectification circuit and a wireless communication apparatus using the rectification circuit.

BACKGROUND

Of rectification circuits used in a radio apparatus which receives and detects a radio signal and processes a resulting signal, there is one that uses MOSFETs (metal-oxide-semiconductor field-effect transistors). In this rectification circuit, a couple of MOSFETs are connected in series with the gate terminal and the source terminal of each MOSFET connected to each other and with the drain terminal and the source terminal of each MOSFET placed on the positive side and the negative side, respectively. One end of a capacitor is connected to a connection portion between the adjacent MOSFETs, and the other end of the capacitor is connected to a signal input terminal. An AC voltage signal is input to the signal input terminal, and an envelope signal is output as a current signal from the positive side.

The MOSFET has a threshold voltage. A current flows between the source and the drain if the gate-source voltage exceeds the threshold voltage. No current flows between the source and the drain if the gate-source voltage is equal to or lower than the threshold voltage. Then, in order to output a current signal even when a faint AC voltage signal, that is lower than the threshold voltage is input to the signal input terminal, a voltage that is approximately equal to the threshold voltage is applied between the gate and the source. As a result, an apparent threshold voltage becomes 0 V. The input AC voltage signal on a positive side of its waveform exceeds the apparent threshold voltage, and the input AC voltage signal on a negative side of its waveform is equal to or lower than the apparent threshold voltage. Thus, a pulsating current is generated and output from the positive side.

However, where a voltage is applied between the gate and the source of the MOSFET so that the apparent threshold voltage becomes about 0 V, a negative leakage current occurs when the AC voltage signal is on the negative side of its waveform. Since a rectification current is generated based on a difference between positive and negative currents, a signal cannot be detected if the difference becomes too small.

BRIEF DESCRIPTION OF THE DRAWINGS

FIGS. 12A and 12B are circuit diagrams of the rectification circuit according to the third embodiment;

DETAILED DESCRIPTION

According to one embodiment, a rectification circuit includes a first field-effect transistor and a bias voltage generation circuit. The first field-effect transistor includes a first gate terminal, a first source terminal, a first source region having a first p-type diffusion layer and connected to the first source terminal, a first drain terminal, and a first drain region having a first n-type diffusion layer and connected to the first drain terminal. The bias voltage generation circuit is configured to apply a DC voltage between the first gate terminal and the first drain terminal.

First Embodiment

Figure 1:
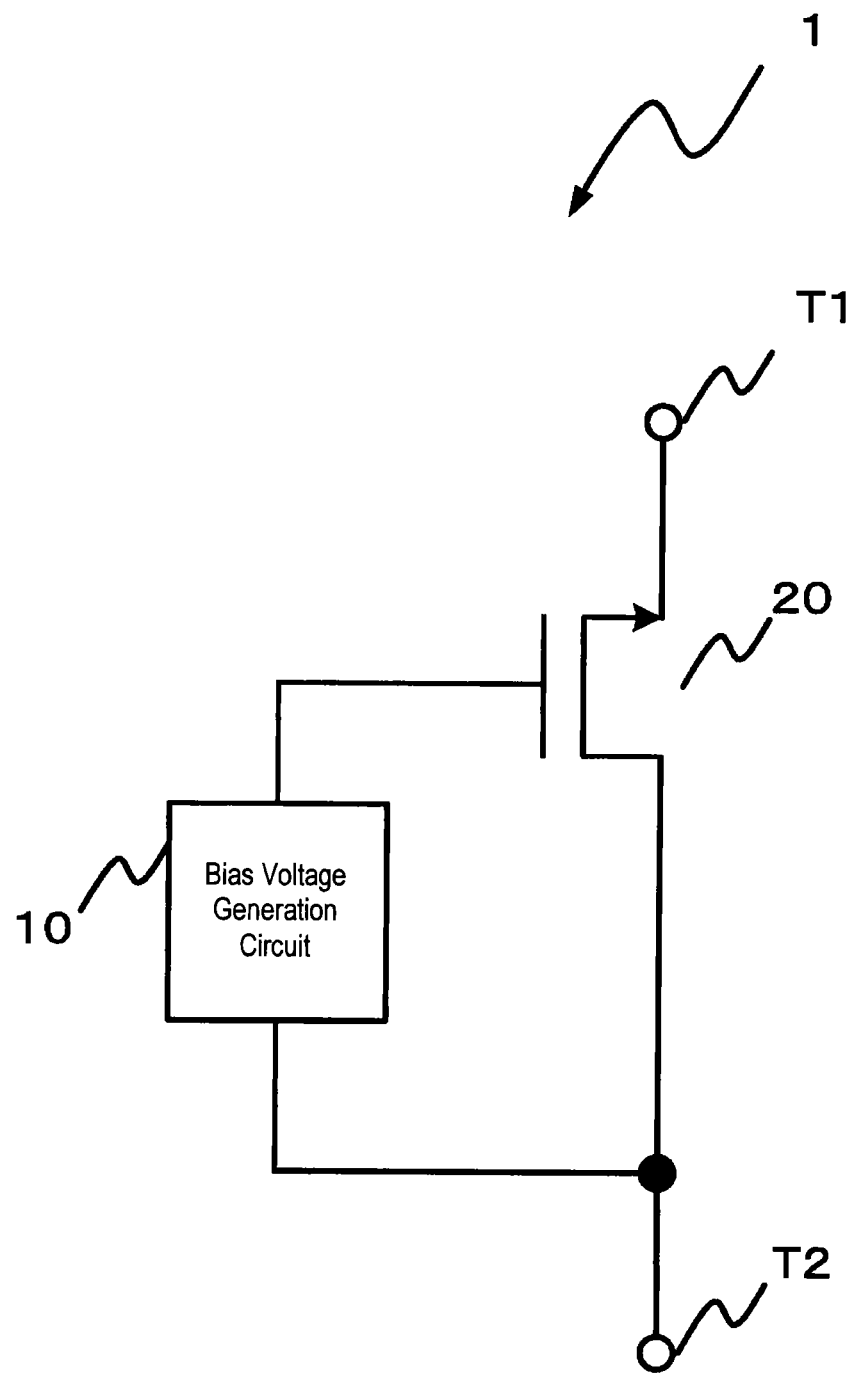
FIG. 1 is a circuit diagram of a rectification circuit according to a first embodiment of the invention.

Embodiments will be hereinafter described below with reference to the accompanying drawings. FIG. 1 is a circuit diagram of a rectification circuit 1 according to a first embodiment. The rectification circuit 1 has a field-effect transistor (FET) having a sharp subthreshold swing. In this embodiment, description will be given on an example in which a tunnel field effect transistor (FET) is used as a field effect transistor having a sharp subthreshold swing.

The rectification circuit 1 has a bias voltage generation circuit 10 and a tunnel FET 20. The source electrode the tunnel FET 20 is connected to a positive terminal T1, and the drain electrode of the tunnel FET 20 is connected to a negative terminal T2. One end of the bias voltage generation circuit 10 is connected to the negative terminal T2 and the drain electrode of the tunnel FET 20, and the other end thereof is connected to the gate electrode of the tunnel FET 20.

The bias voltage generation circuit 10 applies, between the gate and drain of the tunnel FET 20, a voltage (hereinafter referred to as a bias voltage) that is necessary for the tunnel FET 20 to exhibit a rectification characteristic and is lower than a threshold voltage of the tunnel FET 20. It is preferable that the applied bias voltage be approximately equal to the threshold voltage. As a result, an apparent threshold voltage is 0 V. When an AC voltage signal that is input to the negative terminal T2 is in a positive part of its waveform, the AC voltage signal exceeds the apparent threshold voltage. When the AC voltage signal is in a negative part of its waveform, the AC voltage signal is equal to or lower than the apparent threshold voltage. Thus, a half-wave rectified current is output from the positive terminal T1.

Figure 2:
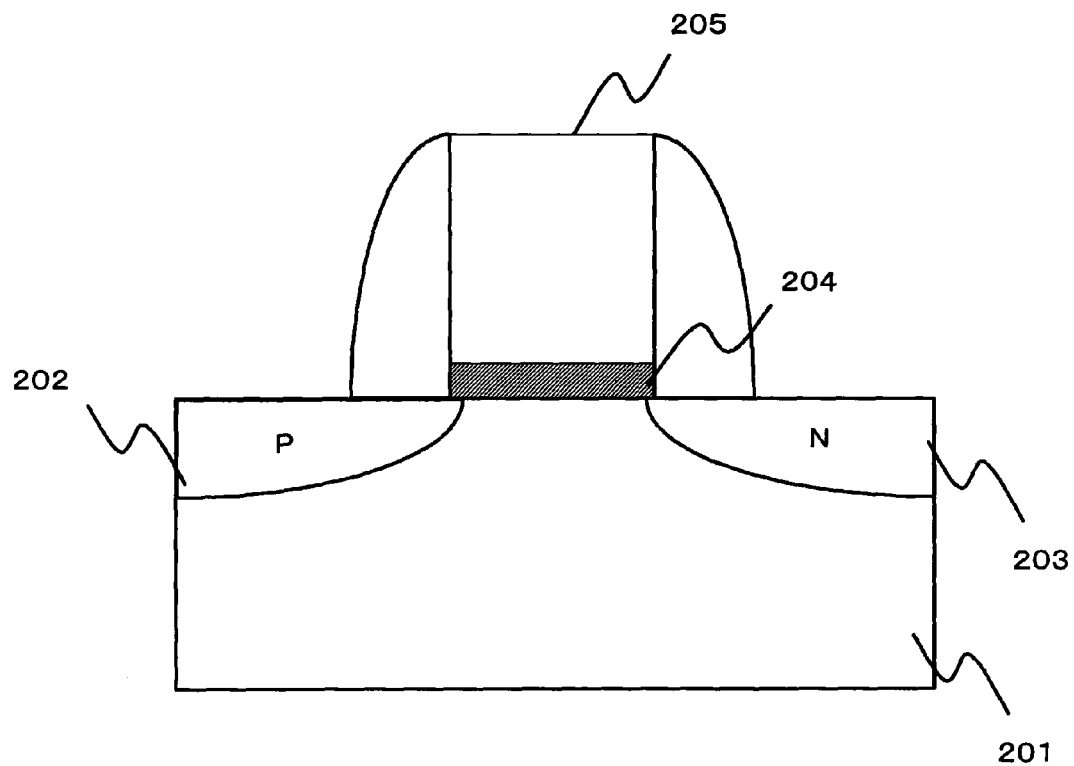
FIG. 2 is a section view of a tunnel FET of the rectification circuit according to the first embodiment.

FIG. 2 is a section view of the tunnel FET 20. In the tunnel FET 20, a source region 202 and a drain region 203 are formed in a semiconductor substrate 201 so as to be spaced from each other. The source region 202 and the drain region 203 are different from each other in conductivity type. The source region 202 and the drain region 203 are a p-type diffusion layer and an n-type diffusion layer, respectively. An insulating film 204 is formed on a region (channel) located between the source region 202 and the drain region 203. A gate electrode 205 is formed on the insulating film 204. The channel may be either an intrinsic semiconductor or a p-type or n-type semiconductor. A tunnel current flows through the tunnel FET 20 when a voltage is applied between the gate and source thereof. The current drive property is determined by the BTBT (band-to-band tunneling) at the source channel junction. Therefore, to increase the drive current, a tunnel barrier is made thinner by forming a source channel junction where the impurity concentration is high and has a steep slope. On the other hand, the off-leakage current is determined by the BTBT at the drain channel junction. Therefore, to decrease the off-leakage current, a tunnel barrier is made thicker by forming a channel drain junction where the impurity concentration is low and has a gentle slope.

Figure 3:
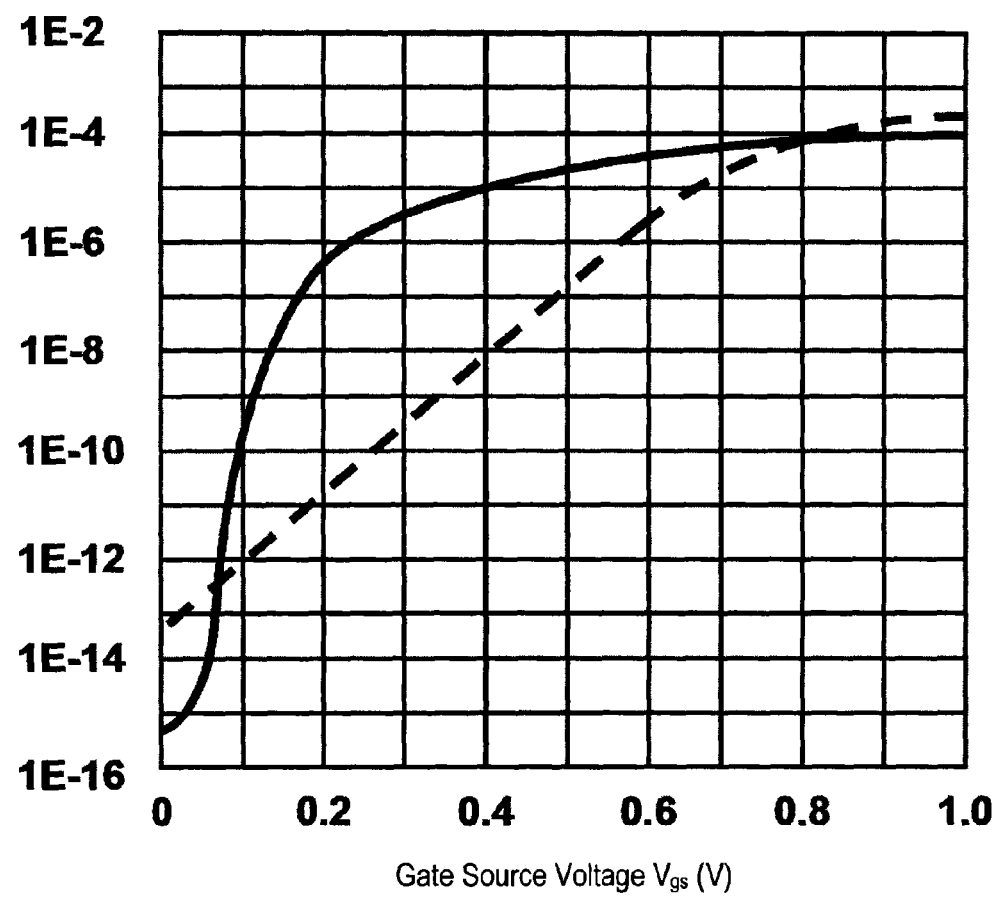
FIG. 3 shows an example of drain current Id versus gate-source voltage $V_{gs}$ characteristics of a tunnel FET and a MOSFET.

FIG. 3 shows an example of a drain current Id versus gate-source voltage $V_{gs}$ characteristics of a tunnel FET and a MOSFET. In FIG. 3, a solid line and a broke line indicate the characteristics of the tunnel FET and the MOSFET, respectively. The tunnel FET has a steeper current-voltage characteristic than the MOSFET in a weak inversion region where $V_{gs}$ is equal to or lower than the threshold voltage. That is, in the tunnel FET, the drain current Id can vary more largely in response to a very small gate-source voltage variation than in the MOSFET.

For example, it is assumed that the tunnel FET 20 of the rectification circuit 1 shown in FIG. 1 is replaced by a MOSFET. If the gate-source voltage is set at 0.4 V and an AC voltage signal having an amplitude of 0.1 V is input to the negative terminal T2, a positive part of the waveform of the input signal produces a current amplification factor of 10. However, a negative part of the waveform causes a leakage current with an amplification factor of ⅒. In contrast, in the circuit shown in FIG. 1, if the gate-source voltage is set at 0.1 V and an AC voltage signal having an amplitude of 0.1 V is input to the negative terminal T2, a positive part of the waveform of the input signal causes a current amplification factor of 1,000 or more. Also, a negative part of the waveform causes a leakage current with an amplification factor of 1/100,000. As is understood from the above discussion, the use of the tunnel FET 20 makes it possible to increase the difference between positive and negative currents by decreasing the negative current (leakage current) that occurs when a negative part of an AC voltage signal is input to the rectification circuit 1.

Figure 4:
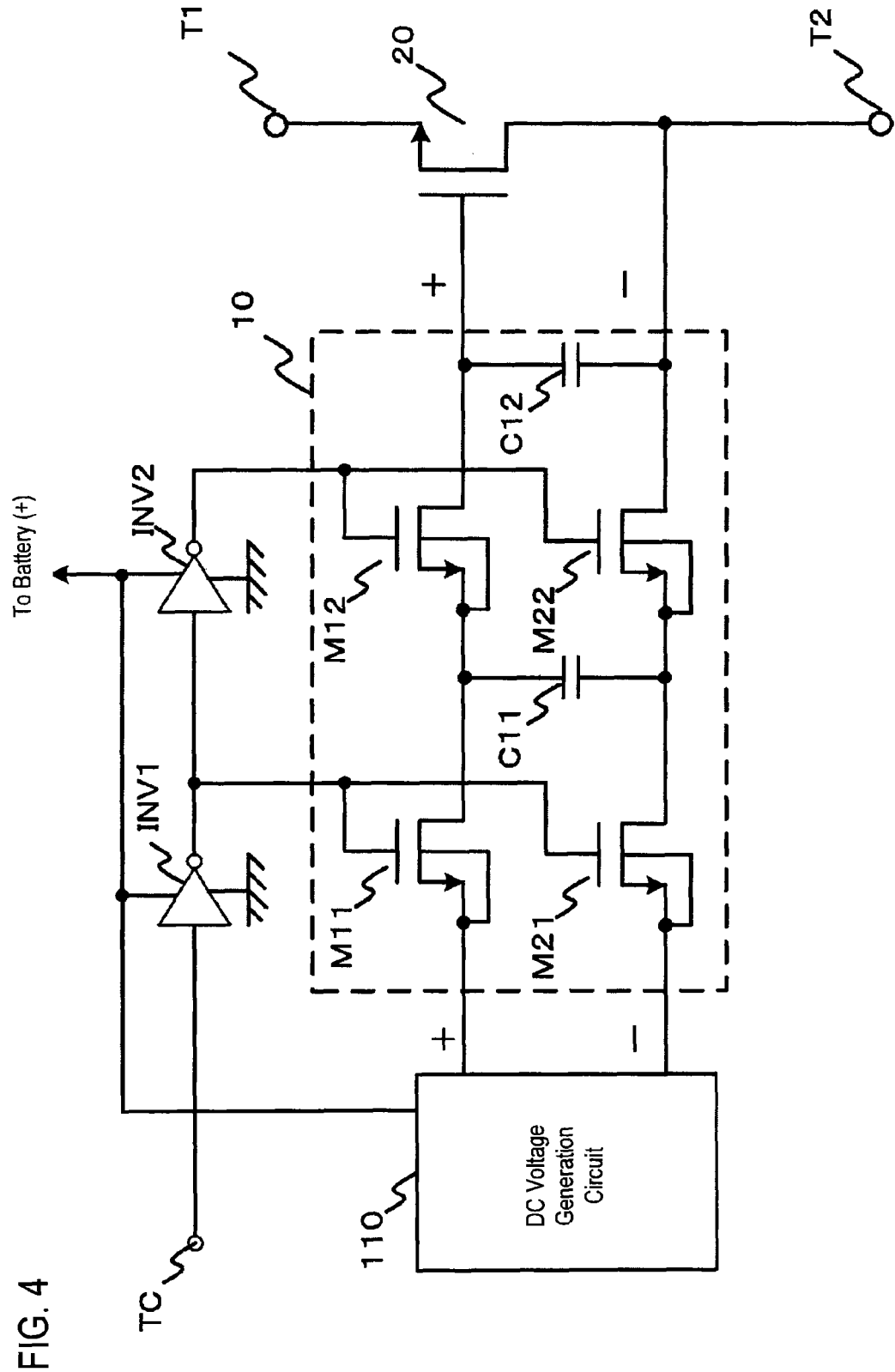
FIG. 4 is a circuit diagram showing an example of the configuration of a bias voltage generation circuit of the rectification circuit according to the first embodiment.

FIG. 4 is a circuit diagram showing an example of the configuration of the bias voltage generation circuit 10 of the rectification circuit 1 shown in FIG. 1. The bias voltage generation circuit 10 includes two NMOS transistors M11 and M12 which are connected in series. Each of the NMOS transistors M11 and M12 functions as a transfer gate and is disposed on a positive line. Likewise, the bias voltage generation circuit 10 includes two NMOS transistors M21 and M22 which are connected in series and are disposed on a negative line. The NMOS transistors M21 and M22 also function as transfer gates. The gate terminals of the NMOS transistors M11 and M21 are connected to each other, and the gate terminals of the NMOS transistors M12 and M22 are also connected to each other. A capacitor C11 is connected between a line that connects the drain terminal of the NMOS transistor M11 and the source terminal of the NMOS transistor M12 and a line that connects the drain terminal of the NMOS transistor M21 and the source terminal of the NMOS transistor M22. Furthermore, a capacitor C12 is connected between the drain terminal of the NMOS transistor M12 and the drain terminal of the NMOS transistor M22.

A DC voltage generation circuit 110 and inverters INV1 and INV2 which are peripheral circuits are connected to the bias voltage generation circuit 10. The DC voltage generation circuit 110 generates a DC voltage that corresponds to the above-mentioned (diode) bias voltage from a main power source of an apparatus which incorporates the rectification circuit 1 according to the embodiment. A specific example of the DC voltage generation circuit 110 will be described later. The DC voltage generated by the DC voltage generation circuit 110 is applied between the positive line and the negative line of the bias voltage generation circuit 10.

An input terminal of the inverter INV1 is connected to a clock input terminal TC, and a clock signal having a constant frequency is input to the input terminal of the inverter INV1. For example, the clock signal is generated by a clock generation circuit (which will be described later). An output terminal of the inverter INV1 is connected to the gate terminals of the NMOS transistors M11 and M21 and an input terminal of the inverter INV2. An output terminal of the inverter INV2 is connected to the gate terminals of the NMOS transistors M12 and M22.

If the clock signal, which is input to the clock input terminal TC, has a logical level "L," the inverter INV1 outputs a logical level "H" and the inverter INV2 outputs a logical level "L." Therefore, the NMOS transistors M11 and M21 are turned on, whereby the capacitor C11 is charged by a DC voltage that is supplied from the DC voltage generation circuit 110. Also, the NMOS transistors M12 and M22 are turned off and hence no DC voltage is applied to the capacitor C12.

On the other hand, if the clock signal, which is input to the clock input terminal TC, has a logical level "H," the inverter INV1 outputs a logical level "L" and the inverter INV2 outputs a logical level "H." Therefore, the NMOS transistors M11 and M21 are turned off and the NMOS transistors M12 and M22 are turned on. Therefore, the charges stored in the capacitor C11 are supplied to the capacitor C12. Since the two ends of the capacitor C12 are connected to respective output terminals of the bias voltage generation circuit 10, the voltage across the two ends of the capacitor C12 is applied between the gate terminal and drain terminal of the diode-connected tunnel FET 20 as a diode bias voltage.

It is not necessary that the DC voltage supplied from the DC voltage generation circuit 110 is the same as the diode bias voltage so long as the voltage between the two ends of the capacitor C12 finally becomes the diode bias voltage. For example, the voltage across the capacitor C12 can be fixed to an arbitrary value by PWM (pulse width modulation) control switching operations of the NMOS transistors M11, M12, M21, and M22. In this case, the DC voltage generation circuit 110 may be omitted, and the main power source may be connected between the positive line and the negative line.

Although the NMOS transistors M11, M12, M21, and M22 are used as the transfer gates of the bias voltage generation circuit 10, PMOS transistors may be used instead. Also, the inverter INV2 may be removed from the circuit shown in FIG. 4, and the NMOS transistors M12 and M22 may be replaced with PMOS transistors.

Figure 5:
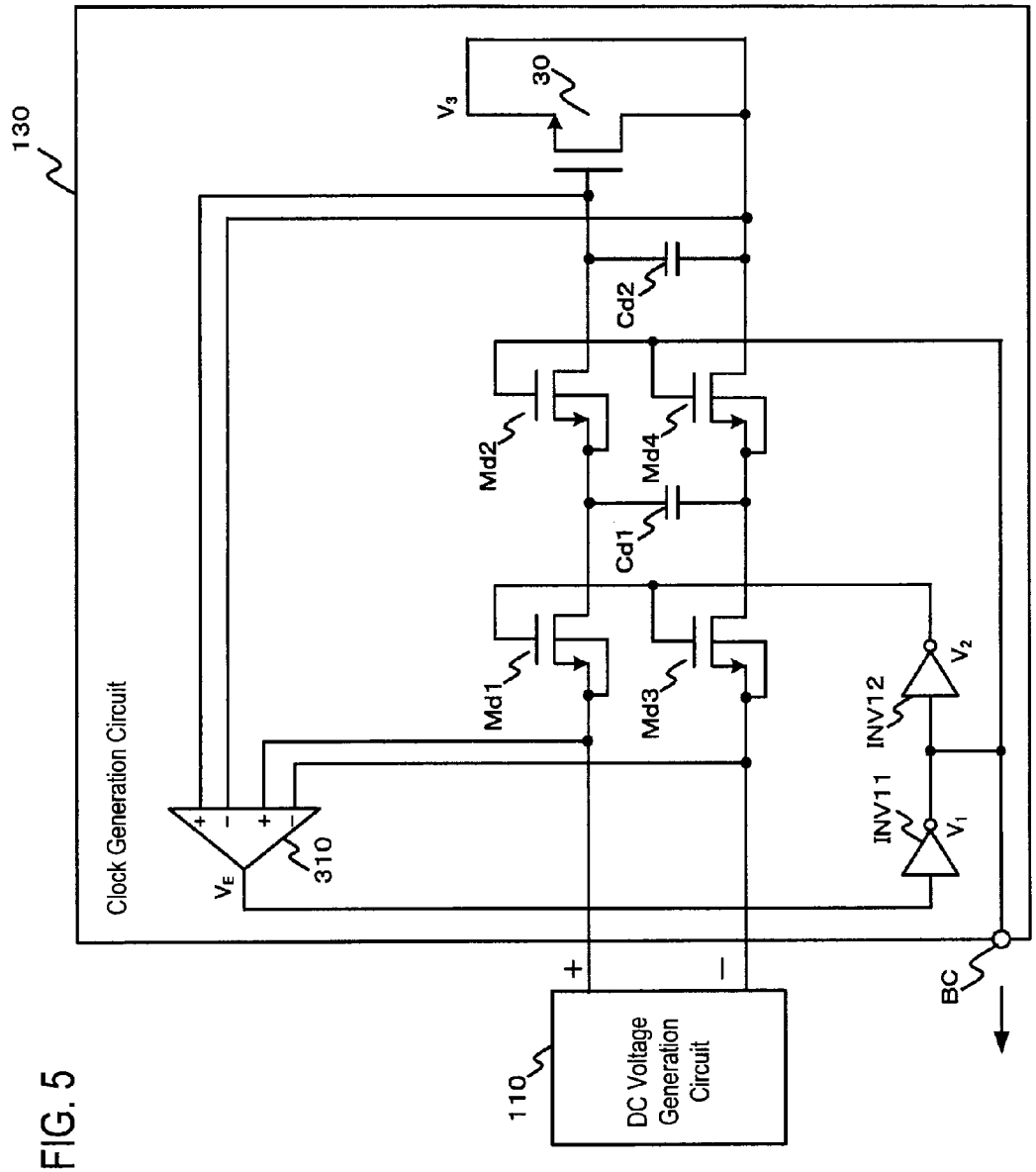
FIG. 5 is a circuit diagram of a clock generation circuit for the rectification circuit according to the first embodiment.

FIG. 5 is a circuit diagram of a clock generation circuit 130 that generates the clock signal to be input to the clock input terminal TC. The clock generation circuit 130 includes a dummy rectification module, a dummy switching module, and an error amplification module 310. The dummy rectification module includes a tunnel FET 30. Both of a source terminal and a drain terminal of the tunnel FET 30 are connected to a negative line and are given a prescribed potential $V_3$. Also, a capacitor Cd2 is connected between the gate terminal and drain terminal of the tunnel FET 30.

The dummy switching module includes NMOS transistors Md1 to Md4, capacitors Cd1 and Cd2, and inverters INV11 and INV12. The NMOS transistors Md1 to Md4 and the capacitors Cd1 and Cd2 are connected to each other in the same manner as the NMOS transistors M11, M12, M21, and M22 and the capacitors C11 and C12 of the bias voltage generation circuit 10.

More specifically, the NMOS transistors Md1 and Md2 are connected to each other in series, function as transfer gates, respectively, and are disposed on the positive line. Likewise, the NMOS transistors Md3 and Md4 are connected to each other in series, function as transfer gates, respectively, and are disposed on the negative line. Gate terminals of the NMOS transistors Md1 and Md3 are connected to an output terminal of the inverter INV12. An input terminal of the inverter INV12 is connected to an output terminal of the inverter INV11. Gate terminals of the NMOS transistors Md2 and Md4 are connected to the output terminal of the inverter INV11. The capacitor Cd1 is connected between a line that connects a drain terminal of the NMOS transistor Md1 and a source terminal of the NMOS transistor Md2 and a line that connects a drain terminal of the NMOS transistor Md3 and a source terminal of the NMOS transistor Md4. Furthermore, the capacitor Cd2 is connected between a drain terminal of the NMOS transistor Md2 and a drain terminal of the NMOS transistor Md4.

As in the bias voltage generation circuit 10, a source terminal of the NMOS transistor Md1 and a source terminal of the NMOS transistor Md3 are connected to the positive terminal and the negative terminal of the DC voltage generation circuit 110, respectively. An error amplification module 310 outputs a base clock voltage $V_E$ that is obtained by amplifying a difference voltage between a voltage between the two ends of the capacitor Cd2 and a reference voltage at a proper gain. The reference voltage is a DC voltage $V_T$ supplied from the DC voltage generation circuit 110 minus a prescribed voltage $V_X$ (e.g., 50 mV), that is, $V_T$-$V_X$. In other words, the error amplification module 310 monitors the voltage across the capacitor Cd2 and generates the base clock voltage $V_E$ according to the monitoring result.

An output terminal of the error amplification module 310 is connected to an input terminal of the inverter INV11. The output terminal of the inverter INV11 is connected to an output terminal BC of the clock generation circuit 130. The output terminal BC is connected to the clock input terminal TC. With the above configuration, when the base clock voltage $V_E$, which is output from the error amplification module 310, becomes equal to or larger than a prescribed level, a signal having a logical level "L" is output from the inverter INV11. When the base clock voltage $V_E$, which is output from the error amplification module 310, becomes lower than the prescribed level, a signal having a logical level "H" is output from the inverter INV11.

Figure 6:
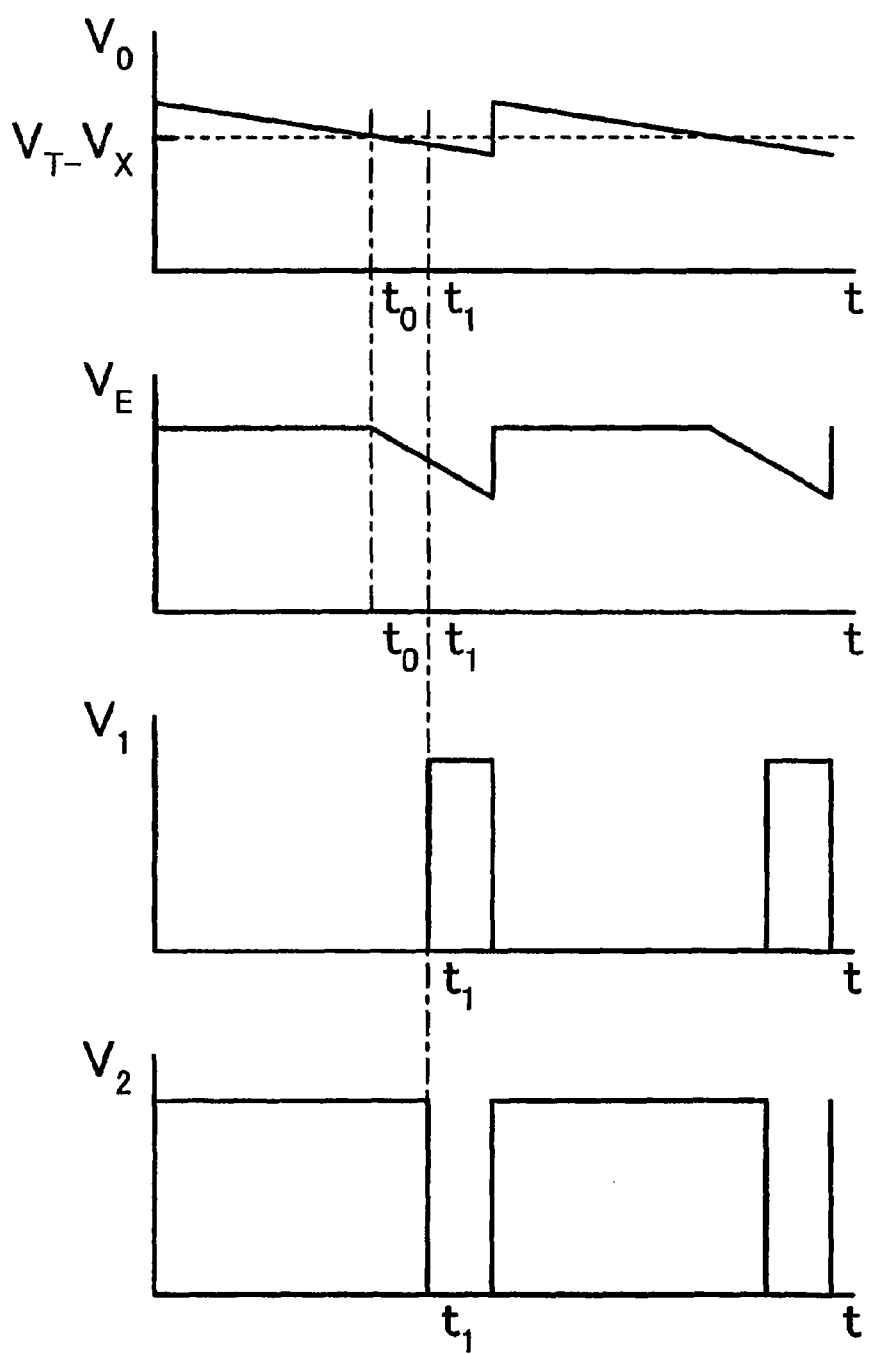
FIG. 6 is a timing chart illustrating how the clock generation circuit for the rectification circuit according to the first embodiment operates.

FIG. 6 is timing charts showing a potential $V_0$ at one end of the capacitor Cd2, the difference voltage $V_E$, which is output from the error amplification module 310, an output potential $V_1$ of the inverter INV11, and an output potential $V_2$ of the inverter INV12.

In a period (until time $t_0$) in which the potential $V_0$ is higher than the reference voltage $V_T$-$V_X$, the error amplification module 310 outputs a saturated positive difference voltage $V_E$ having a prescribed value (first phase). For the inverter INV11, this positive difference voltage $V_E$ is an input signal having a logical level "H." Therefore, in this period, the output potential $V_1$ of the inverter INV11 has a logical level "L," and the output potential $V_2$ of the inverter INV12 has a logical level "H." As a result, the NMOS transistors Md1 and Md3 are turned on, and the DC voltage $V_T$ of the DC voltage generation circuit 110 is applied to the capacitor Cd1.

The capacitor Cd2 is discharged by a leakage current of the tunnel FET 30, and hence the potential $V_0$ thereof decreases gradually and becomes lower than the reference voltage $V_T$-$V_X$ (second phase). That is, the difference voltage $V_E$, which is output from the error amplification module 310, decreases gradually from the positive saturation value and becomes a voltage that serves as an input signal having a logical level "L" for the inverter INV11 (at time $t_1$; third phase). As a result, the output potential $V_1$ of the inverter INV11 becomes a logical level "H," and the output potential $V_2$ of the inverter INV12 becomes a logical level "L." The NMOS transistors Md2 and Md4 are turned on, whereby the charge is transferred from the capacitor Cd1 to the capacitor Cd2. The potential $V_0$ of the capacitor Cd2 becomes approximately equal to the voltage $V_T$, which is larger than the reference voltage $V_T - V_X$. Thus, the first phase is established again. The first to third phases occur repeatedly thereafter.

As the first to third phases occur repeatedly, the output potential $V_1$ takes the form of pulses that occur regularly. Such an output potential $V_1$ is input to the clock input terminal TC as a clock signal. In particular, since as described above the clock generation circuit 130 simulates the bias voltage generation circuit 10 and its peripheral circuits, this clock signal indicates optimum timing that enables efficiently charging of the capacitors C11 and C12 of the bias voltage generation circuit 10. In other words, this makes it possible to always bias the tunnel FET 20 at a voltage that is equal to or larger than a prescribed value.

The MOS transistors used in the clock generation circuit 130 may be PMOS transistors.

Each of the bias voltage generation circuit 10 and the clock generation circuit 130 uses the constant DC voltage, which is supplied from the DC voltage generation circuit 110. However, unless a proper measure were taken, there might occur a case in which this DC voltage does not have a desired value due to, for example, process variations of electronic components making up the DC voltage generation circuit 110. In contrast, configured in a manner described below, the DC voltage generation circuit 110 according to this embodiment can generate a DC voltage that is independent of such process variations.

Figure 7:
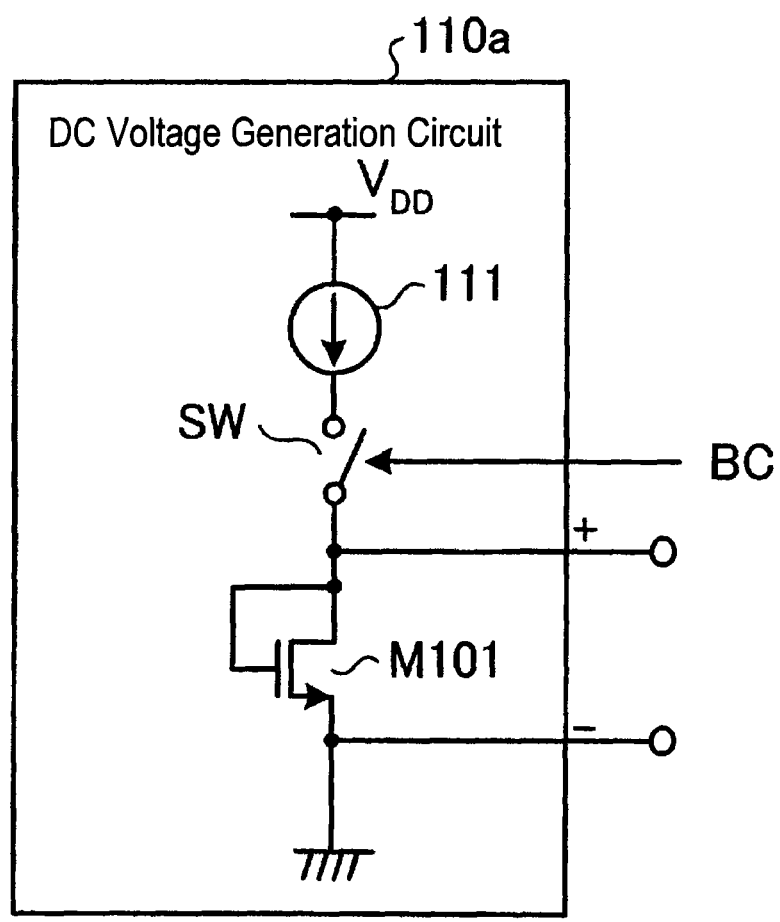
FIG. 7 is a circuit diagram showing an example of a DC voltage generation circuit for the rectification circuit according to the first embodiment.

FIG. 7 is a circuit diagram showing an example of a DC voltage generation circuit 110a. The DC voltage generation circuit 110a shown in FIG. 7 includes a tunnel FET M101 whose gate terminal and drain terminal are connected to each other and a constant current source 111 that generates a constant current using a power source voltage $V_{DD}$. An output terminal of the constant current source 111 is connected to the drain terminal of the tunnel FET M101 via a switch SW. The source terminal of the tunnel FET M101 is grounded, and a gate-source voltage of the tunnel FET M101 corresponds to an output DC voltage $V_T$ of the DC voltage generation circuit 110a.

While the switch SW is on, the constant current is supplied from the constant current source 111 to the tunnel FET M101 and the tunnel FET M101 generates the gate-source voltage according to a value of the constant current. Where the constant current, which is supplied from the constant current source 111, is very small (e.g., 1 µA), the tunnel FET M101 is in an on/off boundary state. That is, the gate-source voltage of the tunnel FET M101 is equivalent to the threshold voltage. This can be said based on the theory that in general the characteristic of a MOS transistor is given by $I_D = \beta(V_{GS} - V_{th})^2$ and the gate-source voltage $V_{GS}$ becomes approximately equal to the threshold voltage $V_{th}$ when the current $I_D$ is made small. Therefore, this voltage can be used as the diode bias voltage of the bias voltage generation circuit 10.

The DC voltage generation circuit 110a is caused to operate intermittently by the switch SW. The current consumption is reduced by turning off the switch SW in a time slot in which the DC voltage generation circuit 110a needs not output a DC voltage. The clock signal, which is output from the above-described clock generation circuit 130, can be used for on/off-controlling the switch SW. For example, where the control terminal of the switch SW is connected to the output terminal BC of the clock generation circuit 130 and the switch SW is turned on when receiving an input having a logical level "H," the DC voltage generation circuit 110a can output a constant DC voltage $V_T$ with such a timing that the bias voltage generation circuit 10 and the clock generation circuit 130 request it.

It is not necessary that the switch SW is kept on all the time when the clock signal, which is input thereto, has the logical level "H." The switch SW may be kept only during a certain part of a period in which the clock signal has the logical level "H."

Figure 8:
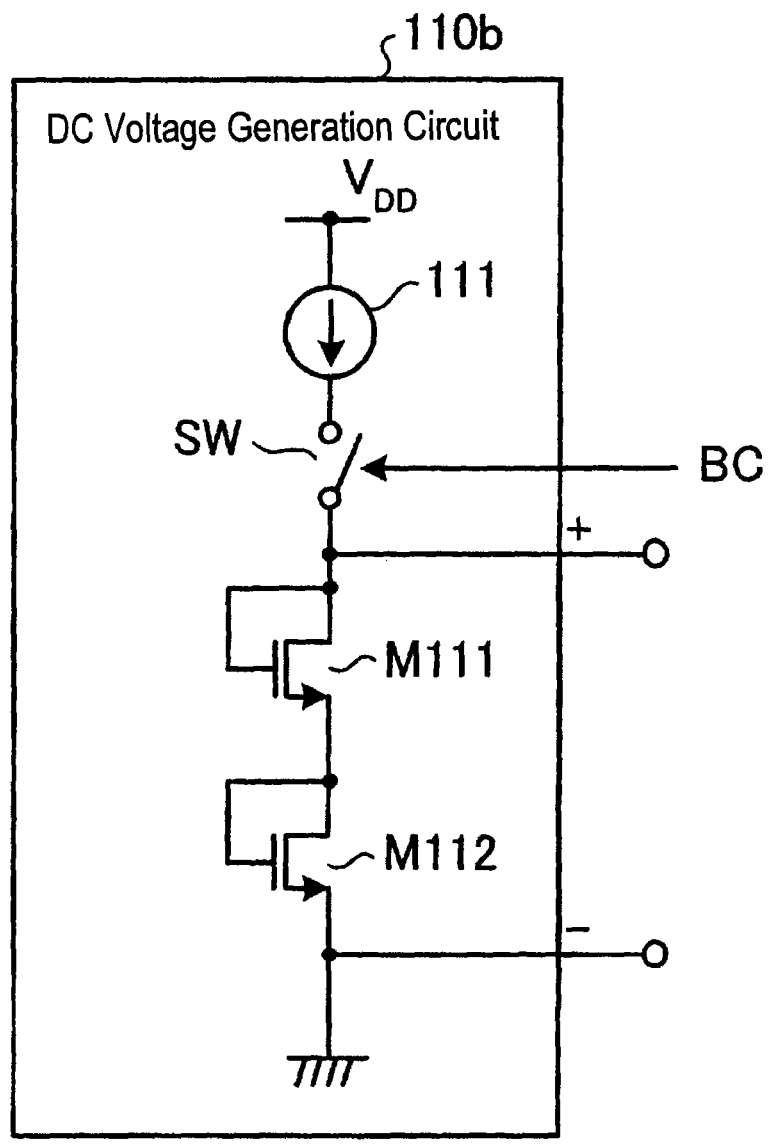
FIG. 8 is a circuit diagram showing another example of the DC voltage generation circuit for the rectification circuit according to the first embodiment.

FIG. 8 is a circuit diagram of another example of a DC voltage generation circuit 110b. The DC voltage generation circuit 110b shown in FIG. 8 includes two tunnel FETs M111 and M112 in each of which a gate terminal and a drain terminal are connected to each other and a constant current source 111 which generates a constant current. The tunnel FETs M111 and M112 are cascade-connected to each other. An output terminal of the constant current source 111 is connected to the drain terminal of the tunnel FET M111 via a switch SW. A sum of a gate-source voltage of the tunnel FET M112 and a gate-source voltage of the tunnel FET M111 corresponds to an output DC voltage $V_T$ of the DC voltage generation circuit 110b.

In the DC voltage generation circuit 110b, the threshold voltage of each of the tunnel FETs M111 and M112 is smaller than that of each of the tunnel FET 20 of the rectification circuit 1 and the tunnel FET 30 of the clock generation circuit 130, and the sum of the gate-source voltages of the tunnel FETs M111 and M112 is equal to the DC voltage $V_T$. As such, even a voltage source using tunnel FETs having small threshold voltages can be used as the DC voltage generation circuit 110 which is not affected by process variations.

It is desirable that the thus-formed DC voltage generation circuit 110 be integrated with the tunnel FET 20 of the rectification circuit 1 in the same chip. In general, tunnel FETs have threshold value variations of about ±100 mV among lots or wafers. Therefore, if the DC voltage generation circuit 110 and the rectification circuit 1 are formed in different chips, a deviation of 100 mV may occur between the threshold-voltage-equivalent voltage generated by the DC voltage generation circuit 110 and the threshold voltage of the tunnel FET 20 of the rectification circuit 1. In contrast, in a single chip, threshold value variations of tunnel FETs are as small as about ±10 mV; almost no differences exist between the threshold-voltage-equivalent voltage generated by the DC voltage generation circuit 110 and the threshold voltage of the tunnel FET 20 of the rectification circuit 1.

As described above, the rectification circuit 1 according to the first embodiment can rectify an AC signal whose effective value is lower than the threshold voltage of the tunnel FET 20, because the bias circuit can apply, between the gate and the drain of the tunnel FET 20, a constant voltage that is necessary for the tunnel FET 20 to exhibit the rectification characteristic and is lower than (preferably close to) its threshold voltage.

Second Embodiment

Figure 9:
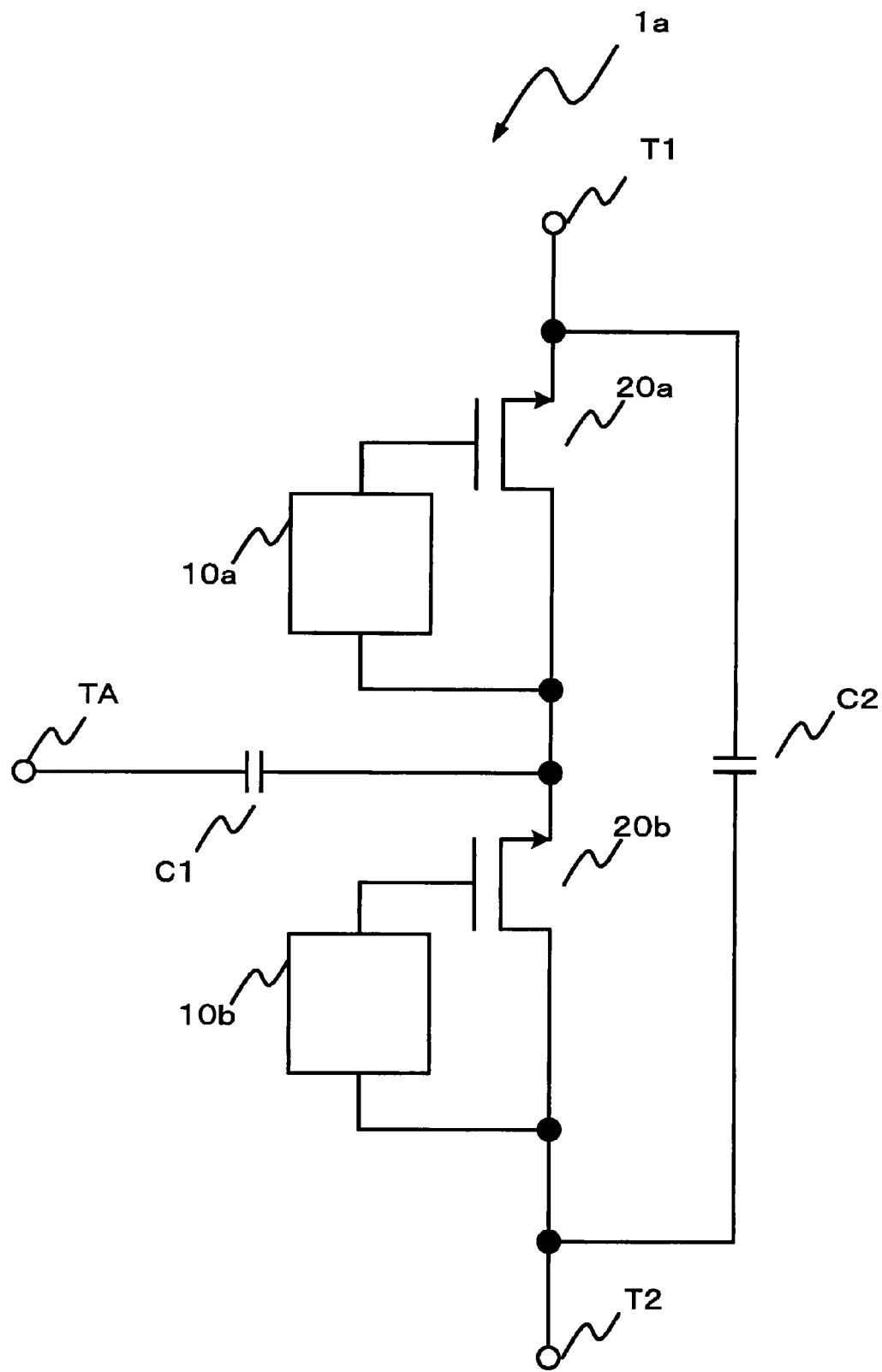
FIG. 9 is a circuit diagram of a rectification circuit according to a second embodiment.

FIG. 9 is a circuit diagram of a rectification circuit 1a according to a second embodiment. The rectification circuit 1a has field effect transistors (e.g., tunnel FETs) each having a sharp subthreshold swing. In the following description, it is assumed that the rectification circuit 1a includes bias voltage generation circuits 10a and 10b and tunnel FETs 20a and 20b. The bias voltage generation circuits 10a and 10b and the tunnel FETs 20a and 20b are configured in the same manners as the bias voltage generation circuit 10 and the tunnel FET 20 described in the first embodiment, respectively.

A source electrode of the tunnel FET 20a is connected to a positive terminal T1. A drain electrode of the tunnel FET 20b is connected to a negative terminal T2. A drain electrode of the tunnel FET 20a and a source electrode of the tunnel FET 20b are connected to each other, and a line connecting those terminals is connected to one end of a capacitor C1. The other end of the capacitor C1 is connected to a signal input terminal TA. The capacitor C1 functions as a coupling capacitor. Where the rectification circuit 1a according to the second embodiment is used in an RFID tag, the capacitor C1 is connected to a loop antenna and functions as a series resonance capacitor.

A gate electrode of the tunnel FET 20a is connected to the drain electrode thereof via the bias voltage generation circuit 10a. A gate electrode of the tunnel FET 20b is connected to the drain electrode thereof via the bias voltage generation circuit 10b. The bias voltage generation circuits 10a and 10b apply bias voltages between the gate and the drain of the tunnel FET 20a and between the gate and the drain of the tunnel FET 20b, respectively.

A capacitor C2 is connected between the source electrode of the tunnel FET 20a and the drain electrode of the tunnel FET 20b. Half-wave-rectified signals generated by the respective tunnel FETs 20a and 20b are smoothed by the capacitor C2. With the above configuration, when a signal is input to the signal input terminal TA, a DC voltage can be obtained from the positive terminal T1 and the negative terminal T2.

Figure 10:
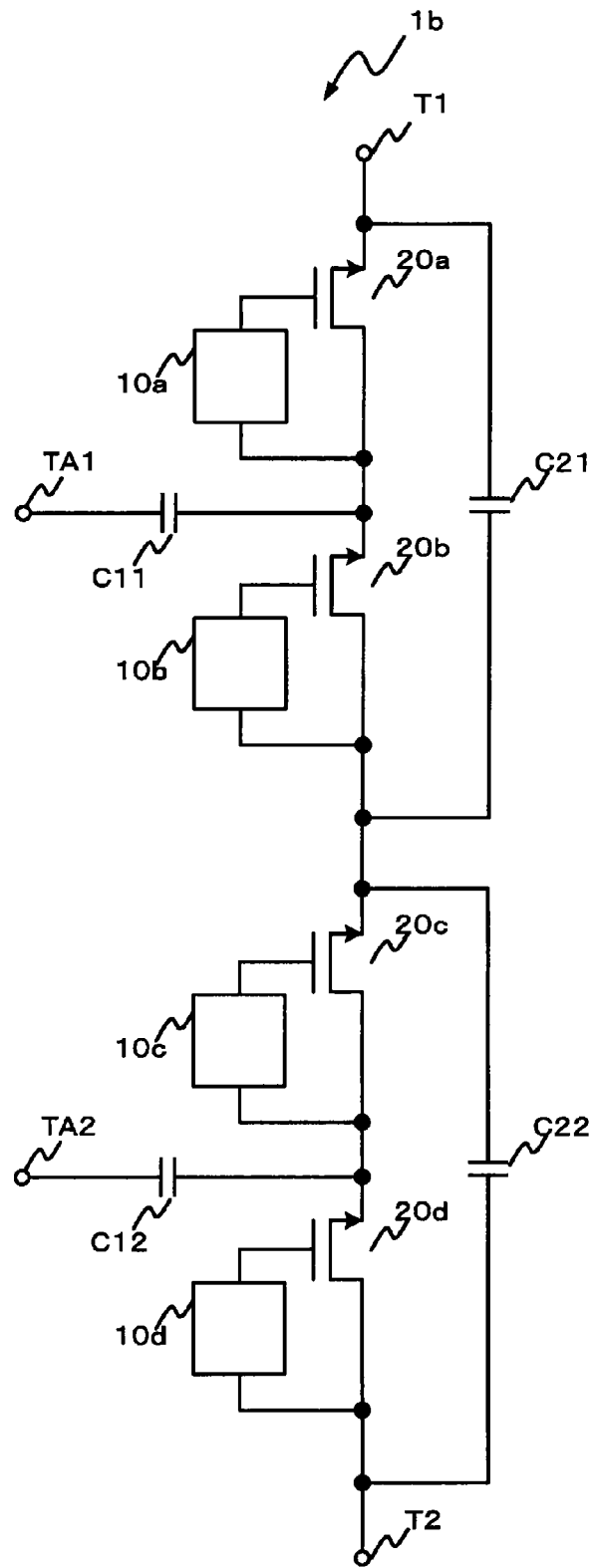
FIG. 10 is a circuit diagram of a modification example of the rectification circuit according to the second embodiment.

Since full-wave rectification is performed by connecting the tunnel FETs 20a and 20b in series, the efficiency and the sensitivity can be enhanced in comparison with the rectification circuit 1 according to the first embodiment. The same circuit as the rectification circuit 1a may be connected to the positive terminal T1 or the negative terminal T2 of the rectification circuit 1a. A rectification circuit 1b shown in FIG. 10 can provide the same advantage as the rectification circuit 1a. Although in the example of FIG. 10 the two rectification circuits 1a are connected to each other in the vertical direction as viewed in the figure, three or more rectification circuits 1a may be connected.

Third Embodiment

Figure 11:
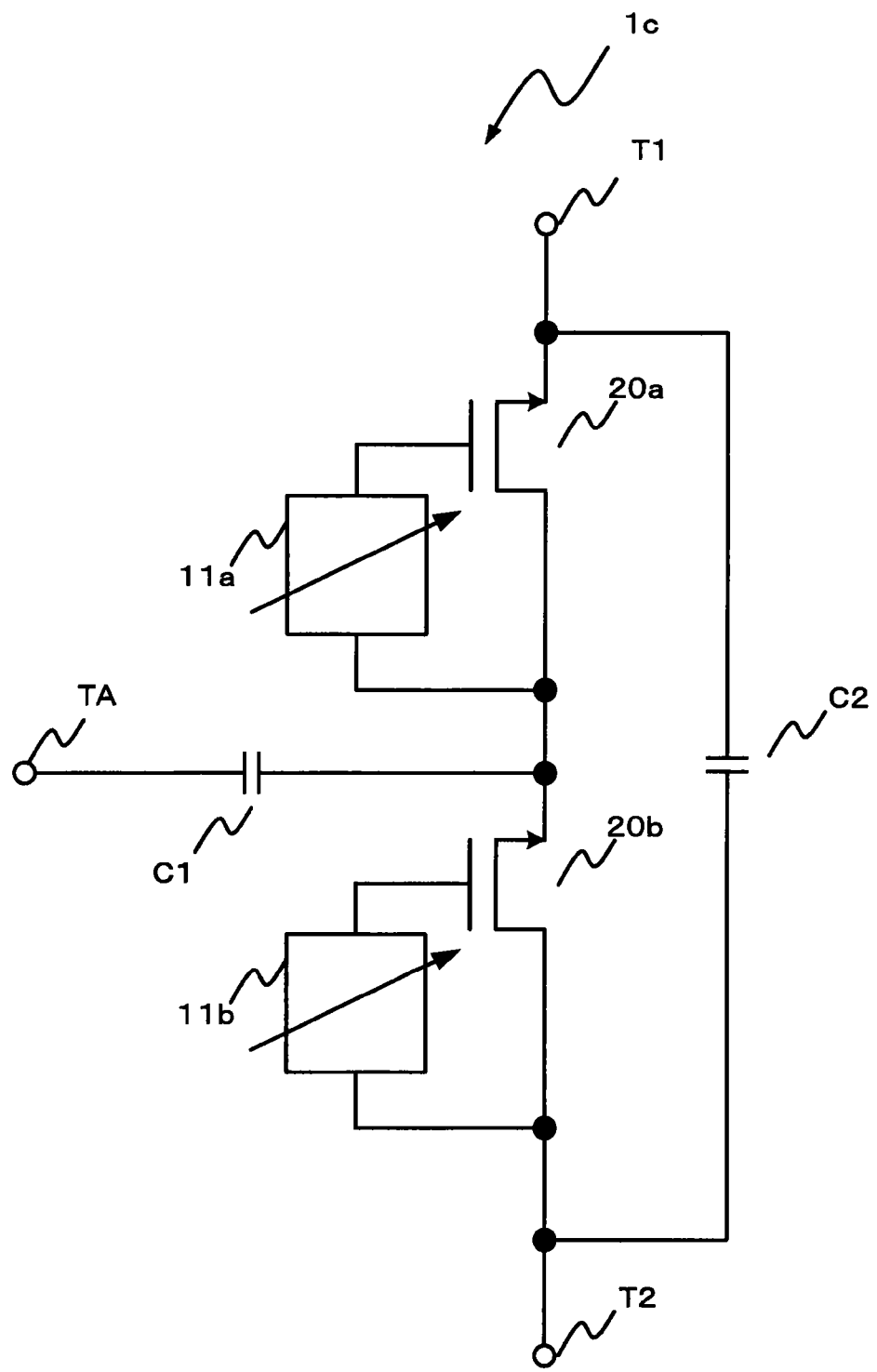
FIG. 11 is a circuit diagram of a rectification circuit according to a third embodiment.

FIG. 11 is a circuit diagram of a rectification circuit 1c according to a third embodiment. The rectification circuit 1c includes variable bias voltage circuits 11a and 11b. The other part of the configuration of the rectification circuit 1c is the same as that of the rectification circuit 1b according to the second embodiment and hence will not be described below.

The variable bias voltage circuits 11a and 11b can adjust the bias voltages by adjusting the current sources 111 according to threshold voltage variations of the tunnel FET 20a and 20b that are caused due to process variations, their temperature characteristics, or the like. Since arbitrary bias voltages can be supplied, the rectification circuit 1c can adjust the signal detection sensitivity adaptively. More specifically, where it is required to detect an input signal with high sensitivity, that is, to detect even a faint signal, the bias voltages can be set to proper voltages. On the other hand, where low-sensitivity signal detection is required, the bias voltages can be set to be lower than that in the case of high-sensitivity signal detection.

To adjust the bias voltages of the variable bias voltage circuits 11a and 11b according to the threshold voltages of the corresponding tunnel FET 20a and 20b, the bias voltages are adjusted by measuring a positive-side impedance and a negative-side impedance by connecting an impedance measuring module 40 to the rectification circuit 1c in manners shown in FIGS. 12A and 12B. The impedance measuring module 40 may include a current source having a current mirror structure, an A/D converter configured to monitor the potential of an output portion of the current mirror, etc.

FIG. 12A shows connections for measurement of a leakage current of the rectification circuit 1c. The impedance measuring module 40 is connected to the positive terminal of the rectification circuit 1c, and the negative terminal is grounded. FIG. 12B shows connections for measurement of a rectification current of the rectification circuit 1c. The impedance measuring module 40 is connected to the negative terminal of the rectification circuit 1c, and the positive terminal is grounded. A leakage current and a rectification current of the rectification circuit 1c are measured under the control of a control circuit (not shown). The rectification circuit 1c can adjust the bias voltages based on the measured leakage current and rectification current.

Figure 13:
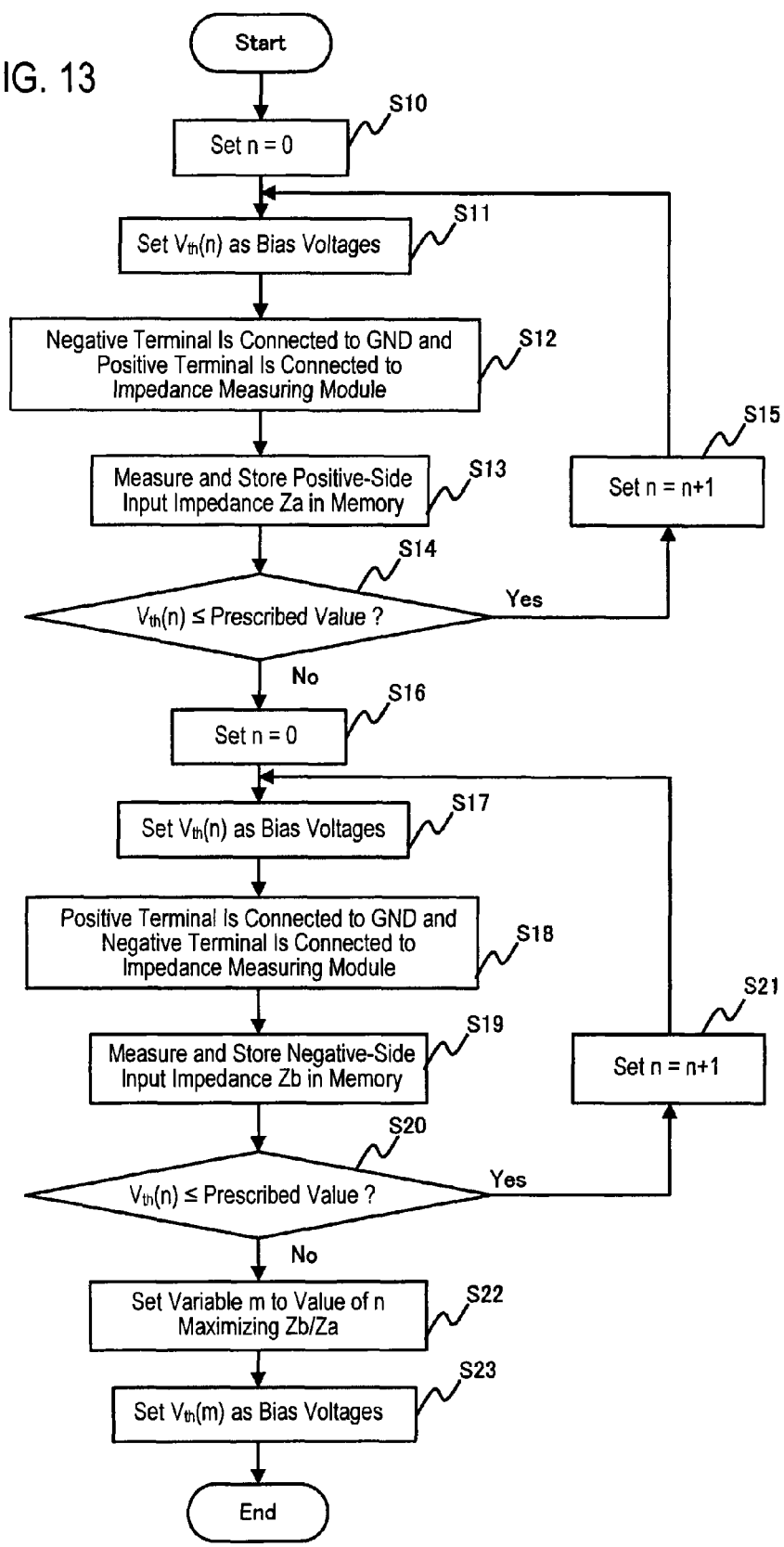
FIG. 13 is a flowchart of an example procedure for adjusting bias voltages in the rectification circuit according to the third embodiment.

FIG. 13 is a flowchart of an example of procedures for adjusting the bias voltages of the variable bias voltage circuits 11a and 11b in the case where high-sensitivity signal detection is required. The following description will be made with an assumption that plural bias voltage setting values ($V_{th}(0)$ to $V_{th}(n-1)$) are stored in a memory in advance. The bias voltage setting values $V_{th}(0)$ to $V_{th}(n-1)$ are assigned numbers 0 to n−1 in ascending order of the voltage values.

First, at step S10, variable n is set to "0." At step S11, a bias voltage $V_{th}(n)$ (in the first execution of the loop, $V_{th}(0)$) is set as bias voltages of the variable bias voltage circuits 11a and 11b. At step S12, as shown in FIG. 12A, the negative terminal of the rectification circuit 1c is grounded and the impedance measuring module 40 is connected to the positive terminal. At step S13, a positive-side input impedance Za with the bias voltage $V_{th}(n)$ is measured and stored in the memory. If $V_{th}(n)$ is equal to or smaller than a prescribed voltage value (Yes at S14), variable n is incremented at step S15 and steps S11 to S14 are executed again.

If $V_{th}(n)$ is larger than the prescribed voltage value (No at S14), variable n is again set to "0" at step S16. At step S17, the bias voltage $V_{th}(n)$ (in the first execution of the loop, $V_{th}(0)$) is set as bias voltages of the variable bias voltage circuits 11a and 11b. At step S18, as shown in FIG. 12B, the positive terminal of the rectification circuit 1c is grounded and the impedance measuring module 40 is connected to the negative terminal. At step S19, a negative-side input impedance Zb with the bias voltage $V_{th}(n)$ is measured and stored in the memory. If $V_{th}(n)$ is equal to or smaller than a prescribed voltage value (Yes at S20), variable n is incremented at step S21 and steps S17 to S20 are executed again. If $V_{th}(n)$ is larger than the prescribed voltage value (No at S20), the positive-side input impedances Za and the negative-side input impedances Zb stored for each variable n are read out, and a ratio of Zb/Za is calculated for each variable n. At step S22, variable m is set to a value of variable n that maximizes Zb/Za. At step S23, a setting value $V_{th}(m)$ is employed as bias voltages of the variable bias voltage circuits 11a and 11b. In this manner, the bias voltages of the variable bias voltage circuits 11a and 11b can be set so that the rectification current is made large and the leakage current is made small.

Fourth Embodiment

Figure 14:
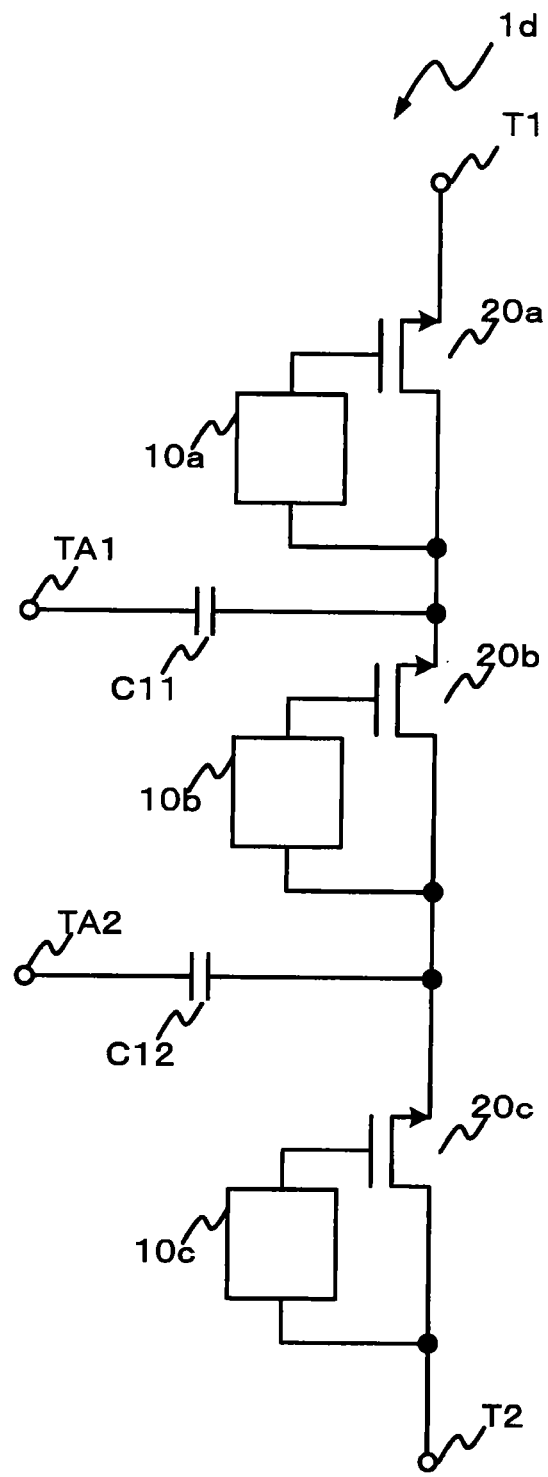
FIG. 14 is a circuit diagram of a rectification circuit according to a fourth embodiment.

FIG. 14 is a circuit diagram of a rectification circuit 1d according to a fourth embodiment. Tunnel FET 20a, 20b, and 20c and bias voltage generation circuit 10a, 10b, and 10c are the same as the tunnel FET 20 and the bias voltage generation circuit 10, which are described in the first embodiment.

A source electrode of the tunnel FET 20a is connected to a positive terminal T1, a source electrode of the tunnel FET 20b is connected to a drain electrode of the tunnel FET 20a, a source electrode of the tunnel FET 20c is connected to a drain electrode of the tunnel FET 20b, and a drain electrode of the tunnel FET 20c is connected to a negative terminal T2. Gate electrodes of the tunnel FET 20a, 20b, and 20c are connected to drain electrodes thereof via the bias voltage generation circuit 10a, 10b, and 10c, respectively. Differential AC signals are input to respective input terminals TA1 and TA2, and supplied to the source electrodes of the tunnel FET 20b and 20c via capacitors C11 and C12, respectively.

Since the tunnel FET 20a, 20b, and 20c are connected in series and the differential signals are input to the input terminals TA1 and TA2, a signal that is two times as large in amplitude as that in the case of the rectification circuit 1 according to the first embodiment is input to the rectification circuit 1d and hence, the rectification efficiency and the sensitivity can be enhanced as compared with the first embodiment.

In this embodiment, plural rectification circuits 1d may be connected to each other in the vertical direction as viewed in FIG. 14 in the same manner as in the case of the second embodiment. That is, the same circuit as the rectification circuit 1d may be connected to the positive terminal T1 or the negative terminal T2 of the rectification circuit 1d shown in FIG. 14.

Fifth Embodiment

In a rectification circuit according to a fifth embodiment, a diode-connected floating gate tunnel FET is used as a rectification device. A floating gate of the floating gate tunnel FET is charged so as to have a constant voltage that is necessary for the floating gate tunnel FET to exhibit the rectification characteristic and is lower than (preferably close to) a threshold voltage of the floating gate tunnel FET.

Figure 15:
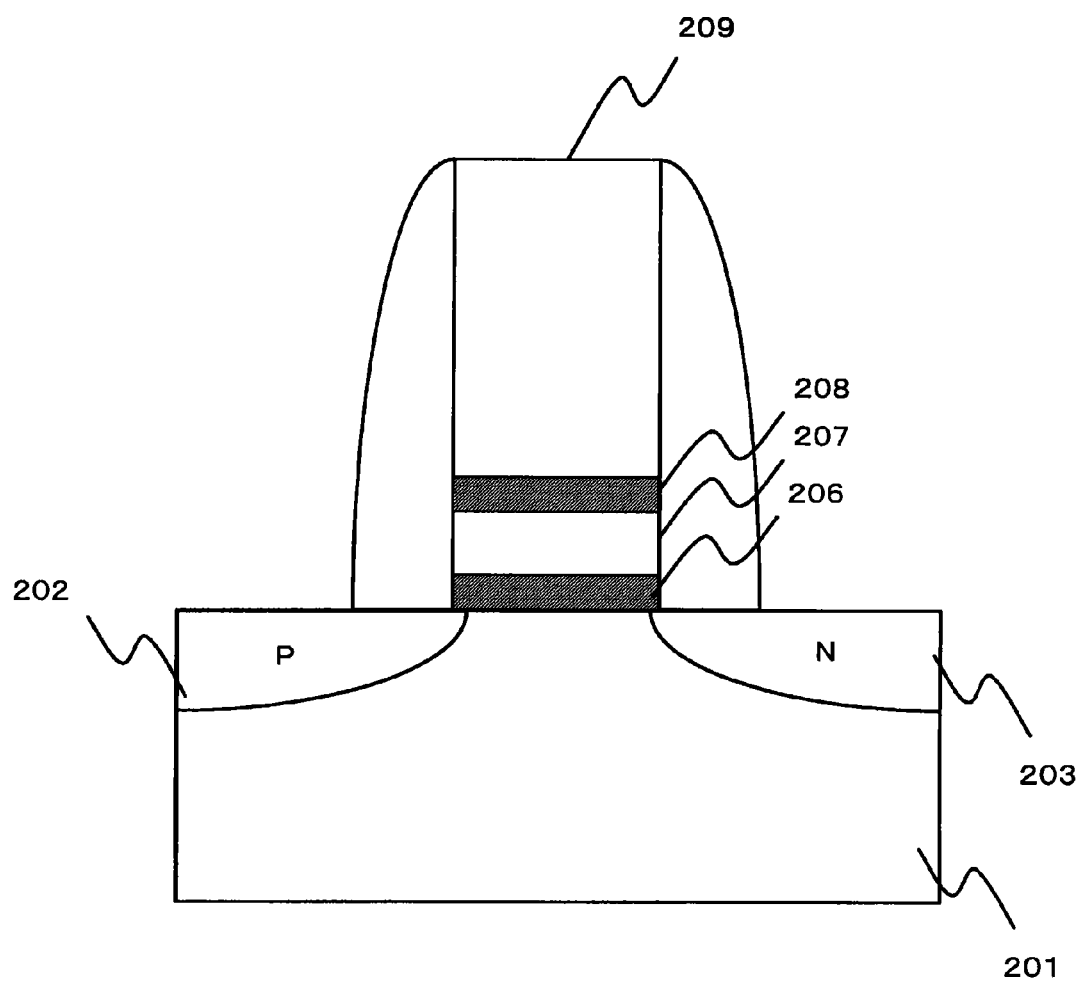
FIG. 15 is a section view of a tunnel FET of a rectification circuit according to a fifth embodiment.

FIG. 15 is a section view of the floating gate tunnel FET. In the floating gate tunnel FET, a source region 202 and a drain region 203 are formed in a semiconductor substrate 201 so as to be spaced from each other. The source region 202 and the drain region 203 are different from each other in conductivity type. Specifically, the source region 202 and the drain region 203 are a p-type diffusion layer and an n-type diffusion layer, respectively. A first insulating film 206 is formed on a region (channel) located between the source region 202 and the drain region 203, a floating gate 207 is formed on the first insulating film 206, a second insulating film 208 is formed on the floating gate 207, and a control gate 209 is formed on the second insulating film 208. The channel may be an intrinsic semiconductor, a p-type semiconductor, or an n-type semiconductor.

Figure 16:
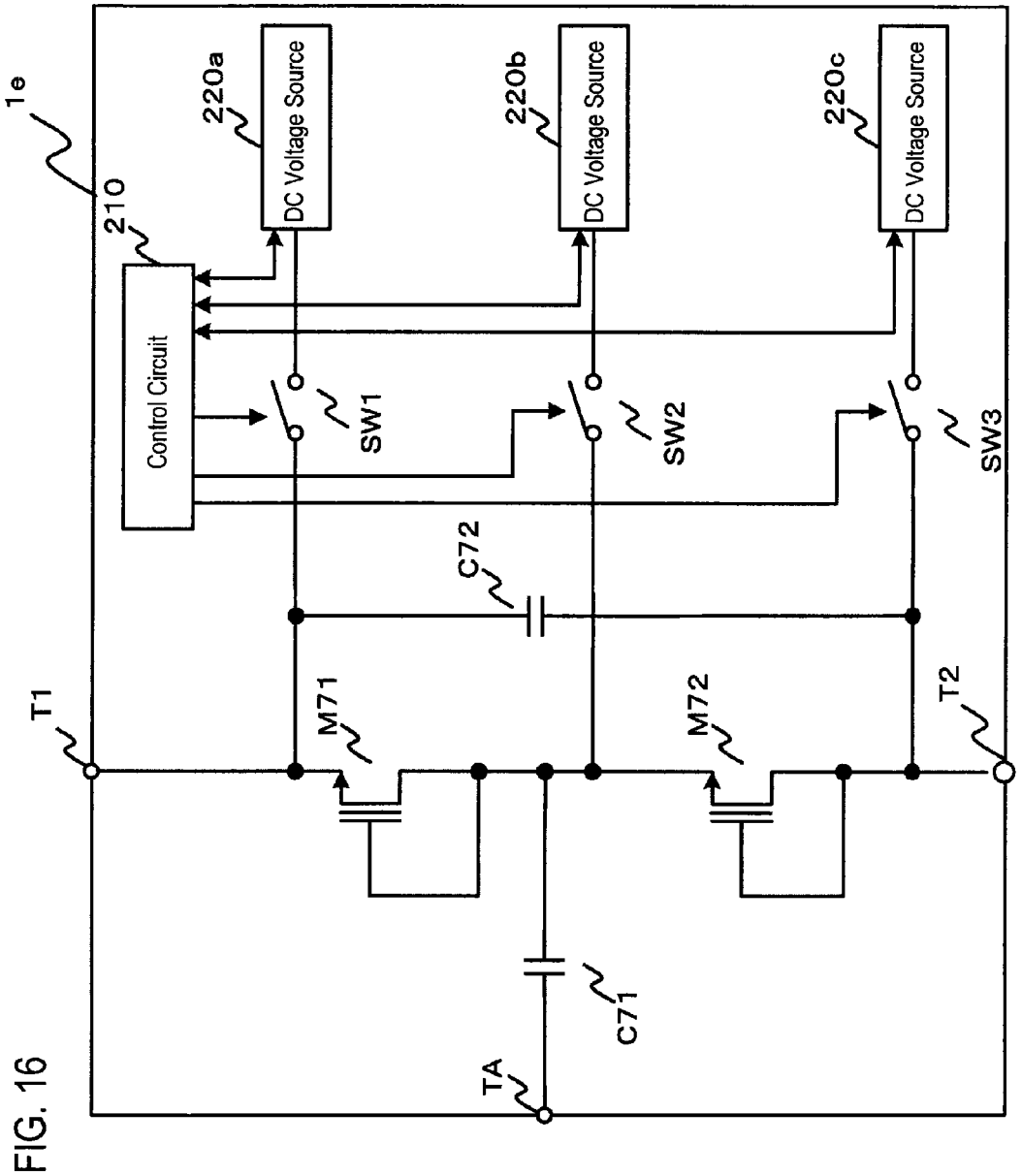
FIG. 16 is a circuit diagram of a rectification circuit according to the fifth embodiment.

FIG. 16 is a circuit diagram of a rectification circuit 1e according to the fifth embodiment. As shown in FIG. 16, a gate control terminal and a drain terminal of a floating gate tunnel FET M71 is connected to each other and a source terminal of the floating gate tunnel FET M71 is connected to a positive terminal T1. The control gate terminal and the drain terminal are connected to each other so as to turn on/off the gate-source switch according to whether an input signal to an input terminal TA is positive or negative.

The floating gate of the floating gate tunnel FET M71 is charged so as to have a voltage (diode bias voltage thereof) that is necessary for the floating gate tunnel FET M71 to exhibit the rectification characteristic. In this example, it is assumed that the diode bias voltage is equal to the threshold voltage of the floating gate tunnel FET M71. With this measure, the threshold voltage of the floating gate tunnel FET M71 can be regarded as 0 V equivalently. Thereby, any AC signal including an AC signal whose effective voltage is equal to or lower than the threshold voltage can be rectified.

Likewise, a gate control terminal and a drain terminal of a floating gate tunnel FET M72 are connected to each other, and a drain terminal of the floating gate tunnel FET M72 is connected to a negative terminal T2. The floating gate of the floating gate tunnel FET M72 is charged so as to have a diode bias voltage thereof. The floating gate tunnel FET M72 exhibits the same rectification characteristic as the floating gate tunnel FET M71.

The drain terminal of the floating gate tunnel FET M71 and the source terminal of the floating gate tunnel FET M72 are connected to each other, and a line connecting them is connected to one end of a capacitor C71. The other end of the capacitor C71 is connected to the signal input terminal TA. The capacitor C71 functions as a coupling capacitor. Where the rectification circuit 1e according to the fifth embodiment is used in an RFID tag, the capacitor C71 is connected to a loop antenna and functions as a series resonance capacitor.

A capacitor C72 is connected between the source electrode of the floating gate tunnel FET M71 and the drain electrode of the floating gate tunnel FET M72. Half-wave-rectified signals generated by the respective floating gate tunnel FETs M71 and M72 are smoothed by the capacitor C72. Thereby, a DC voltage can be obtained from between the two terminals of the capacitor C72, that is, between the positive terminal T1 and the negative terminal T2.

In particular, the diode circuit including the floating gate tunnel FETs M71 and M72 and the capacitors C71 and C72 can rectify even an AC signal having as small in amplitude as about 100 mV which has been difficult to rectify in a related art. Therefore, where used in an RFID tag, this rectification circuit 1e can rectify a signal of a faint radio wave. That is, even a tag that is very distant from a base station can rectify a signal, and long-distance communication is thus enabled.

The rectification circuit 1e also includes switches SW1, SW2, and SW3, a control circuit 210, and DC voltage sources 220a, 220b, and 220c. These components are ones for charging and discharging of the floating gate tunnel FETs M71 and M72. One end of the switch SW1 is connected to the source terminal of the floating gate tunnel FET M71, and the other end of the switch SW1 is connected to an output terminal of the DC voltage source 220a. One end of the switch SW2 is connected to the source terminal of the floating gate tunnel FET M72, and the other end of the switch SW2 is connected to an output terminal of the DC voltage source 220b. One end of the switch SW3 is connected to the drain terminal of the floating gate tunnel FET M72, and the other end of the switch SW3 is connected to an output terminal of the DC voltage source 220c. The switches SW1, SW2, and SW3 are also connected to the control circuit 210 and on/off-controlled by the control circuit 210. Each of the DC voltage sources 220a, 220b, and 220c is also connected to the control circuit 210, and their operation modes are selected and their output potentials are determined according to control signals that are output from the control circuit 210.

Figure 17:
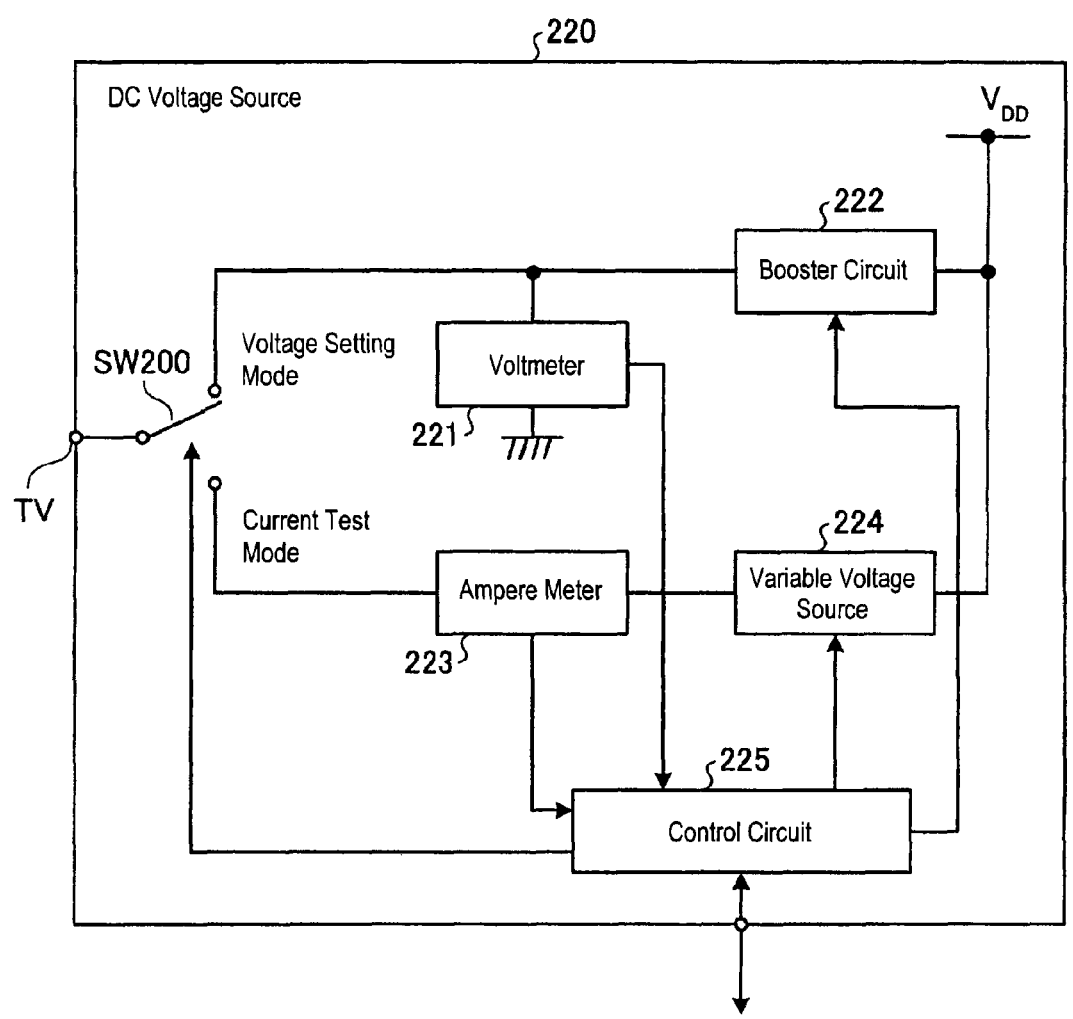
FIG. 17 is a circuit diagram of each of DC voltage sources of the rectification circuit according to the fifth embodiment.

FIG. 17 is a circuit diagram of a DC voltage source 220 as representative one of the DC voltage sources 220a, 220b, and 220c. As shown in FIG. 17, the DC voltage source 220 includes a switch SW200 configured to switch between two operation modes, that is, a voltage setting mode and a current test mode. The DC voltage source 220 also includes a voltmeter 221, a booster circuit 222, an ampere meter 223, a variable voltage source 224, and a control circuit 225. The voltmeter 221 and the booster circuit 222 are electrically connected to a terminal, corresponding to the voltage setting mode, of the switch SW200. The variable voltage source 224 is electrically connected to a terminal, corresponding to the current test mode, of the switch SW200 via the ampere meter 223. The control circuit 225 supplies the control circuit 210 with signals indicating a voltage value and a current value which are detected by the voltmeter 221 and the ampere meter 223, respectively while controlling the switch SW200 and voltages to be set in the booster circuit 222 and the variable voltage source 224 according to the control signal output from the control circuit 210.

Figure 18:
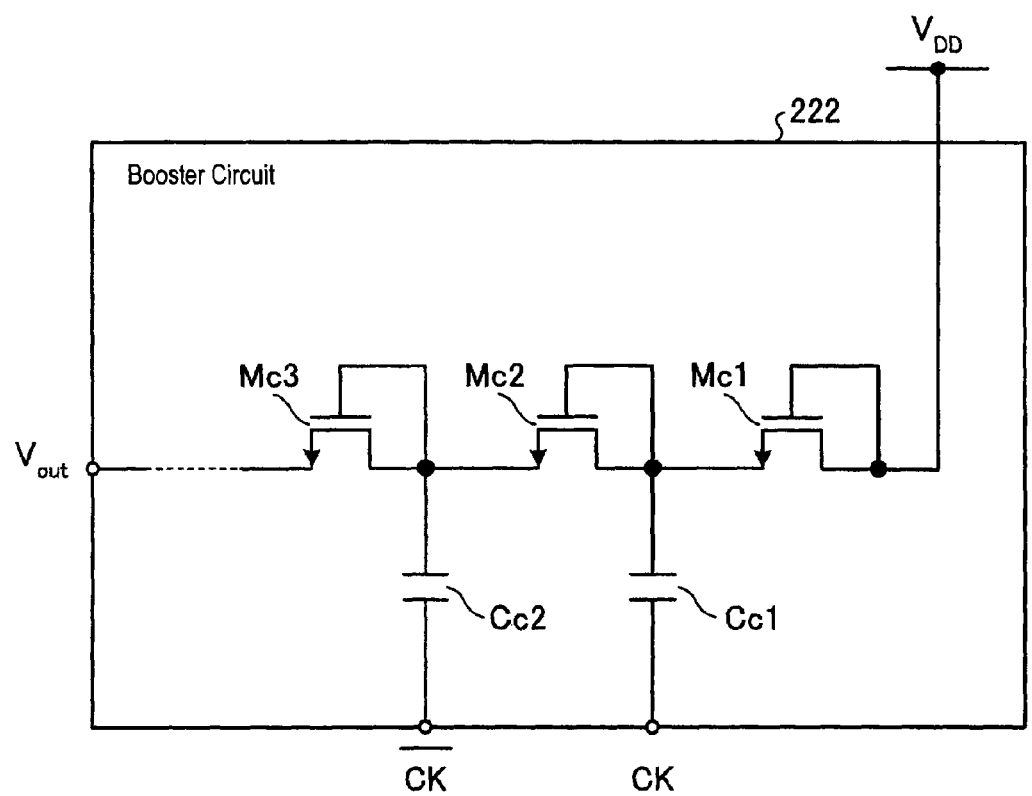
FIG. 18 is a circuit diagram showing an example of a booster circuit of the DC voltage source of the rectification circuit according to the fifth embodiment.

FIG. 18 is a circuit diagram showing an example of the booster circuit 222 of the DC voltage source 220. This booster circuit 222 is a general charge pump circuit. A clock signal CK is input via a capacitor Cc1 which is connected to a connecting point between transistors Mc1 and Mc2, and opposite-phase clock signal $\overline{CK}$ is input via a capacitor Cc2 which is connected to a connecting point between the transistor Mc2 and a transistor Mc3. The broken line in FIG. 18 indicates a repetition of the above structure. As the clock signals are input, a voltage is shifted toward an output terminal Vout while being boosted starting from a power source voltage $V_{DD}$. Where N transistors exist, a voltage that is output from the output terminal Vout is given by $(N+1)(V_{DD}-V_{th})$ where $V_{th}$ is a threshold voltage of the transistors Mc1 to Mc3. The booster circuit 222 can provide a voltage of about 10 V for floating gate setting.

Figure 19:
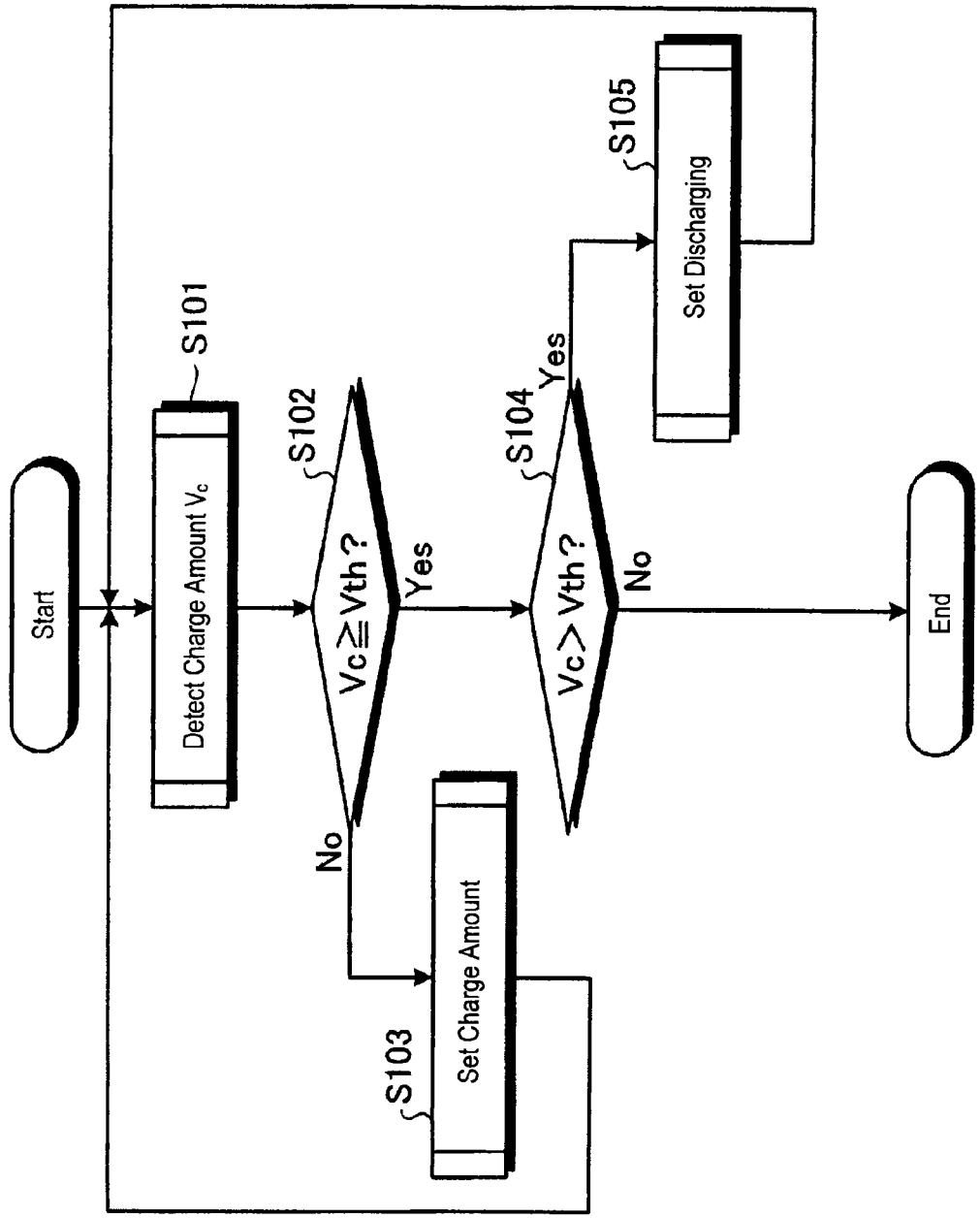
FIG. 19 is a flowchart showing a method for controlling the floating gates of the floating gate tunnel FETs of the rectification circuit according to the fifth embodiment.
Figure 20:
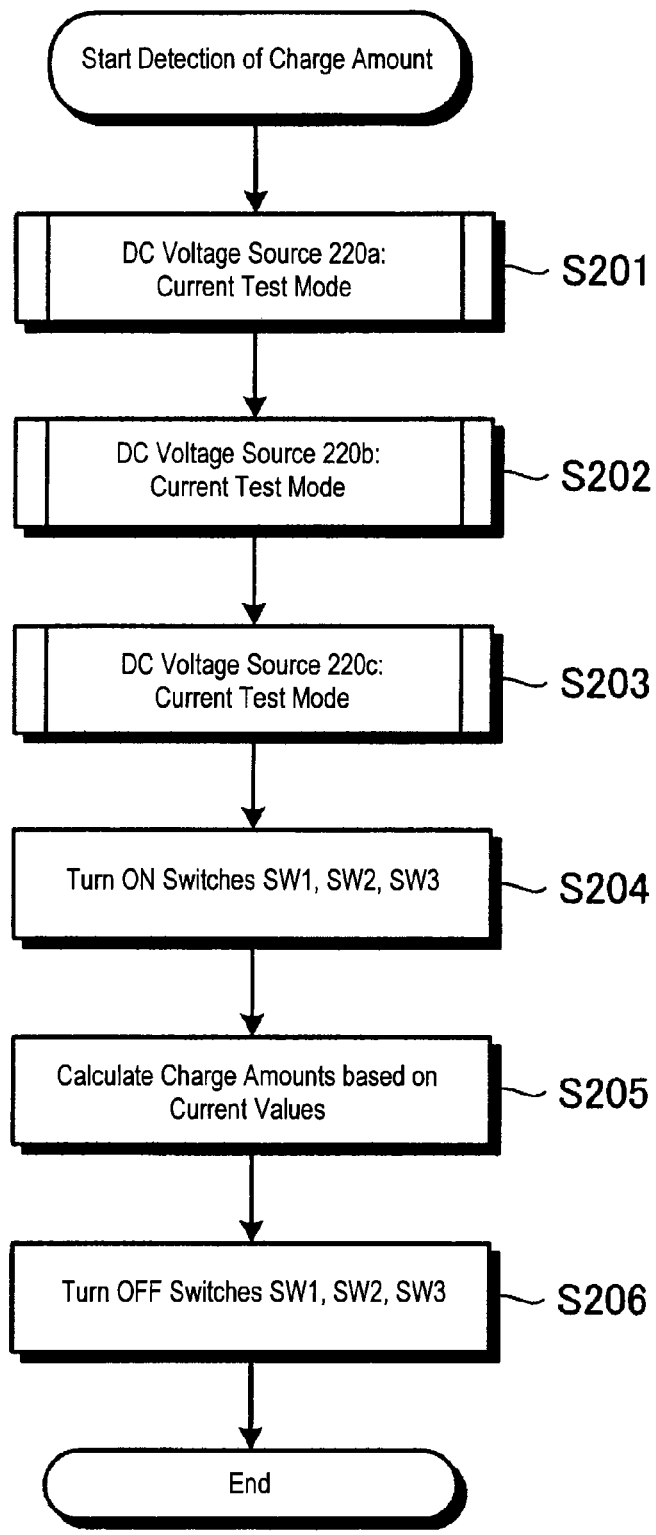
FIG. 20 is a flowchart of a charge amount detection process.

A method for controlling the control gates of the floating gate tunnel FETs M71 and M72 will be described below. FIG. 19 is a flowchart showing a floating gate control method. First, at step S101, the amount of charge stored in the floating gate of each of the floating gate tunnel FETs M71 and M72 is detected. FIG. 20 is a flowchart of a charge amount detection process. Before detection of charge amounts, at steps S201 to S203 the control circuit 210 of the rectification circuit 1e supplies the control circuits 225 of the DC voltage sources 220a to 220c with control signals that instruct the control circuits 225 to switch the operation mode to the current test mode and indicate voltages to be set in the variable voltage sources 224, respectively. At step S204, the control circuit 210 turns on the switches SW1 to SW3.

Figure 21:
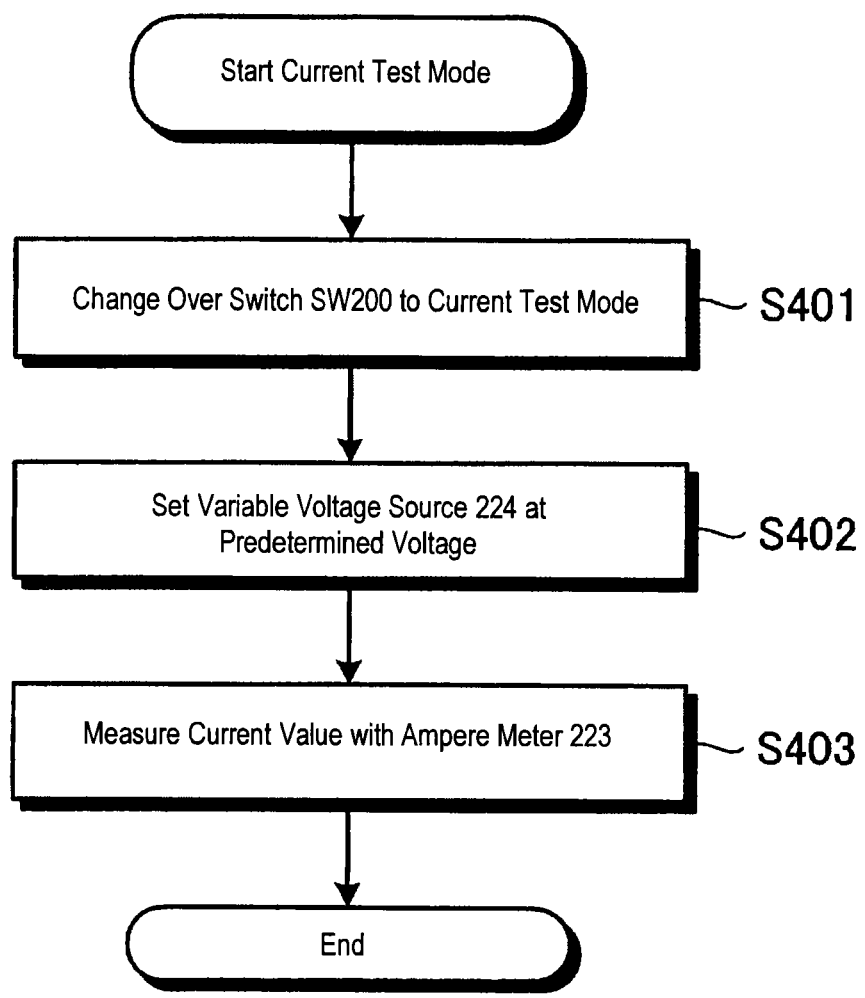
FIG. 21 is a flowchart showing how each DC voltage source operates in a current test mode.

FIG. 21 is a flowchart showing how each DC voltage source 220 operates in the current test mode. At step S401, receiving the control signal from the control circuit 210, the control circuit 225 of each DC voltage source 220 switches the switch SW200 to the current test mode. At step S402, the control circuit 225 sets the above-mentioned voltage in the variable voltage source 224. For example, to detect a charge amount of the floating gate of the floating gate tunnel FET M71, the voltage of the variable voltage source 224 of the DC voltage source 220a is set at 1 V and the voltage of the variable voltage source 224 of the DC voltage source 220b is set at 0 V. At step S403, a current value is measured by the ampere meter 223 of each DC voltage source 220. Actually, the current value is measured after the step S204.

At step S205, receiving the current values measured by the respective DC voltage sources 220a to 220c, the control circuit 210 calculates a voltage $V_c$ which corresponds to the charge amount based on the current values. At step S206, the control circuit 210 turns off the switches SW1 to SW3.

Returning back to FIG. 19, at step S102, the control circuit 210 determines as to whether or not the calculated voltage $V_c$ is equal to or larger than the threshold value $V_{th}$. This determination can be made when a voltage applied to the source terminal of the floating gate tunnel FET M71 or M72 is set to be higher than a voltage applied to its drain voltage as in the above-mentioned example manner of setting voltages (the voltages of the variable voltage sources 224 of the DC voltage sources 220a and 220b are set at 1 V and 0 V, respectively).

For example, if a current has flown between the source and the drain of the floating gate tunnel FET M71, that is, if the current value obtained by the DC voltage source 220a is a large value, it is determined that the voltage V, of the floating gate of the floating gate tunnel FET M71 is equal to or larger than its threshold voltage $V_{th}$. If the voltage V, is lower than the threshold voltage $V_{th}$, that is, if the current value obtained by the DC voltage source 220a is zero or sufficiently small (No at S102), at step S103 the floating gate of the floating gate tunnel FET M71 is charged. Before the charging, a difference voltage between a floating gate voltage and the threshold voltage is calculated. The difference voltage is calculated by repeating the same process as the above-described charge amount detection process. For example, to calculate the difference voltage between the floating gate voltage and the threshold voltage of the floating gate tunnel FET M71, the voltage of the variable voltage source 224 of the DC voltage source 220a is set at 0 V and the voltage of the variable voltage source 224 of the DC voltage source 220b is set at 0.5 V. Then, the switches SW1 and SW2 are turned on and a current value obtained by the DC voltage source 220b is examined.

In this case, the gate voltage $V_g$, which is applied to the channel of the floating gate tunnel FET M71, is given by $V_g=V_f+0.5$ where $V_f$ denotes the voltage of the floating gate. In this state, the current flowing through the DC voltage source 220b is proportional to $(V_g-V_{th})^2=(V_f+0.5-V_{th})^2$. If the obtained current value is large, the voltage of the variable voltage source 224 of the DC voltage source 220b is set to be lower than 0.5 V. If the obtained current value is zero or a small value, the voltage of the variable voltage source 224 of the DC voltage source 220b is set to be higher than 0.5 V. In this manner, the voltage difference between the floating gate voltage and the threshold voltage is determined by reading a voltage value corresponding to a current value in a boundary state. A voltage to be supplied in the voltage setting mode, that is, a voltage to be set in the boosting circuit 222 of each DC voltage source 220 is determined based on the determined voltage difference.

Figure 22:
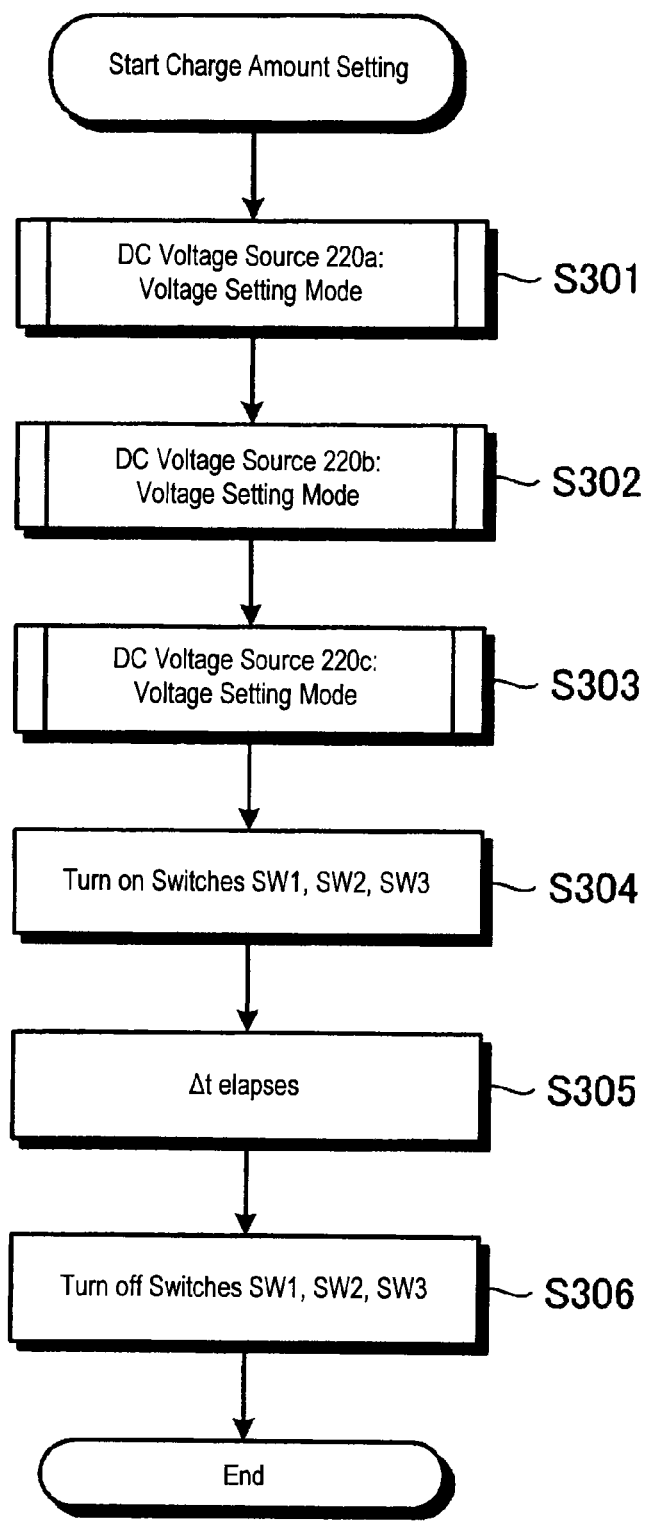
FIG. 22 is a flowchart of a charging amount setting process.

FIG. 22 is a flowchart of a charge amount setting process. At steps S301 to S303, the control circuit 210 supplies the control circuits 225 of the DC voltage sources 220a to 220c with control signals that instruct them to switch the operation mode to the voltage setting mode and indicate voltages to be set in the booster circuits 222, respectively. At step S304, the control circuit 210 turns on the switches SW1 to SW3.

Figure 23:
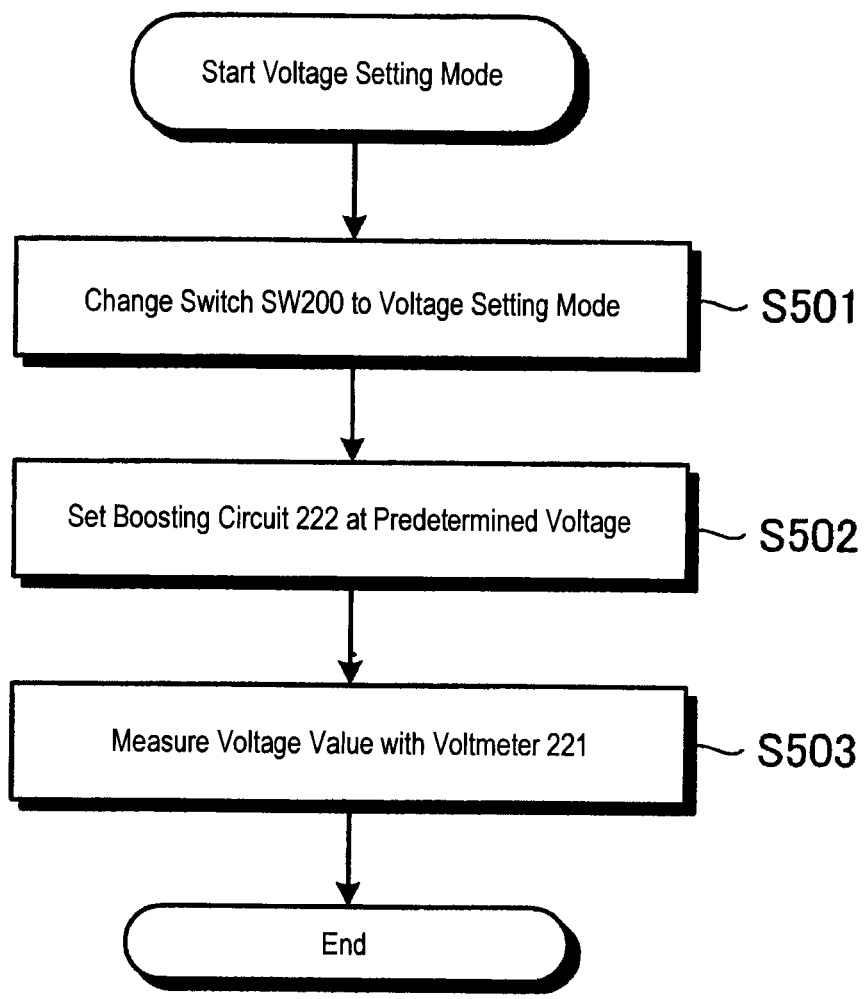
FIG. 23 is a flowchart showing how each DC voltage source operates in a voltage setting mode.

FIG. 23 is a flowchart showing how each DC voltage source 220 operates in the voltage setting mode. At step S501, receiving the above-mentioned control signal from the control circuit 210, the control circuit 225 of each DC voltage source 220 switches the switch SW200 to the voltage setting mode. At step S502, the control circuit 225 sets the above-mentioned voltage in the boosting circuit 222. For example, to charge the floating gate of the floating gate tunnel FET M71, the voltage of the boosting circuit 222 of the DC voltage source 220a is set to be high and the voltage of the boosting circuit 222 of the DC voltage source 220b is set at 0 V. At step S503, a voltage value of the floating gate of the floating gate tunnel FET M71 is measured by the voltmeter 221 of each DC voltage source 220. Actually, a voltage value is measured after the above-mentioned step S304.

At step S305, the control section 210 causes the boosting circuit 222 to apply a high voltage to the floating gate of the floating gate tunnel FET M71 for a predetermined time Δt. At step S306, the control section 210 turns off the switches SW1 to SW3. The time Δt is selected to be such a value as to enable charging of the floating gate and not to cause saturation.

Referring back to FIG. 19, if it is determined at step S102 that the voltage $V_c$ is equal to or larger than the threshold voltage $V_{th}$ (Yes at S102), that is, the current value obtained by the DC voltage source 220a is large, then it is determined at step 104 as to whether or not the voltage $V_c$ is larger than the threshold voltage $V_{th}$. In the case where the voltage $V_c$ is larger than the threshold voltage $V_{th}$ (Yes at S104), the floating gate tunnel FET M71 is always on and hence the rectification efficiency is low. To avoid this state, the floating gate is discharged at step S105.

A discharging process is similar to the charge amount setting process shown in FIG. 22. More specifically, to discharge the floating gate of the floating gate tunnel FET M71, for example, the voltage of the boosting circuit 222 of the DC voltage source 220a is set at 0 V and the voltage of the boosting circuit 222 of the DC voltage source 220b is set to be high. Then, the switches SW1 and SW2 are turned on. As a result, electrons are injected into the floating gate of the floating gate tunnel FET M71 from its source terminal, and the charges stored in the floating gate can be reduced.

If the voltage $V_c$ is not larger than the threshold voltage $V_{th}$ (No at S104), that is, the voltage $V_c$ is equal to the threshold voltage $V_{th}$, the control of the floating gate is finished.

Although the above description is directed to the floating gate tunnel FET M71, similar processes are executed for the floating gate tunnel FET M72. It is possible to set the voltage of the threshold voltage of each floating gate tunnel FET at a large value. In this case, each floating gate tunnel FET cannot rectify a faint radio signal. In particular, when the rectification circuit 1e according to this embodiment is applied to RFID tags, only RFID tags that are located near a base station can perform rectifying operation. In this manner, the communication distance can be controlled using the charging amount of the floating gate. Thus, the performance of an RFID tag can be changed between a case where a severe condition relating to security or privacy is set and a case where long-distance communication is required.

As described above, in the rectification circuit 1e according to the embodiment, the floating gate of each diode-connected floating gate tunnel FET holds a constant voltage that is necessary for the floating gate tunnel FET to exhibit the rectification characteristic and is approximately equal to its threshold voltage. Therefore, the rectification circuit 1e can rectify even an AC signal whose effective value is smaller than the threshold voltage.

Sixth Embodiment

Figure 24:
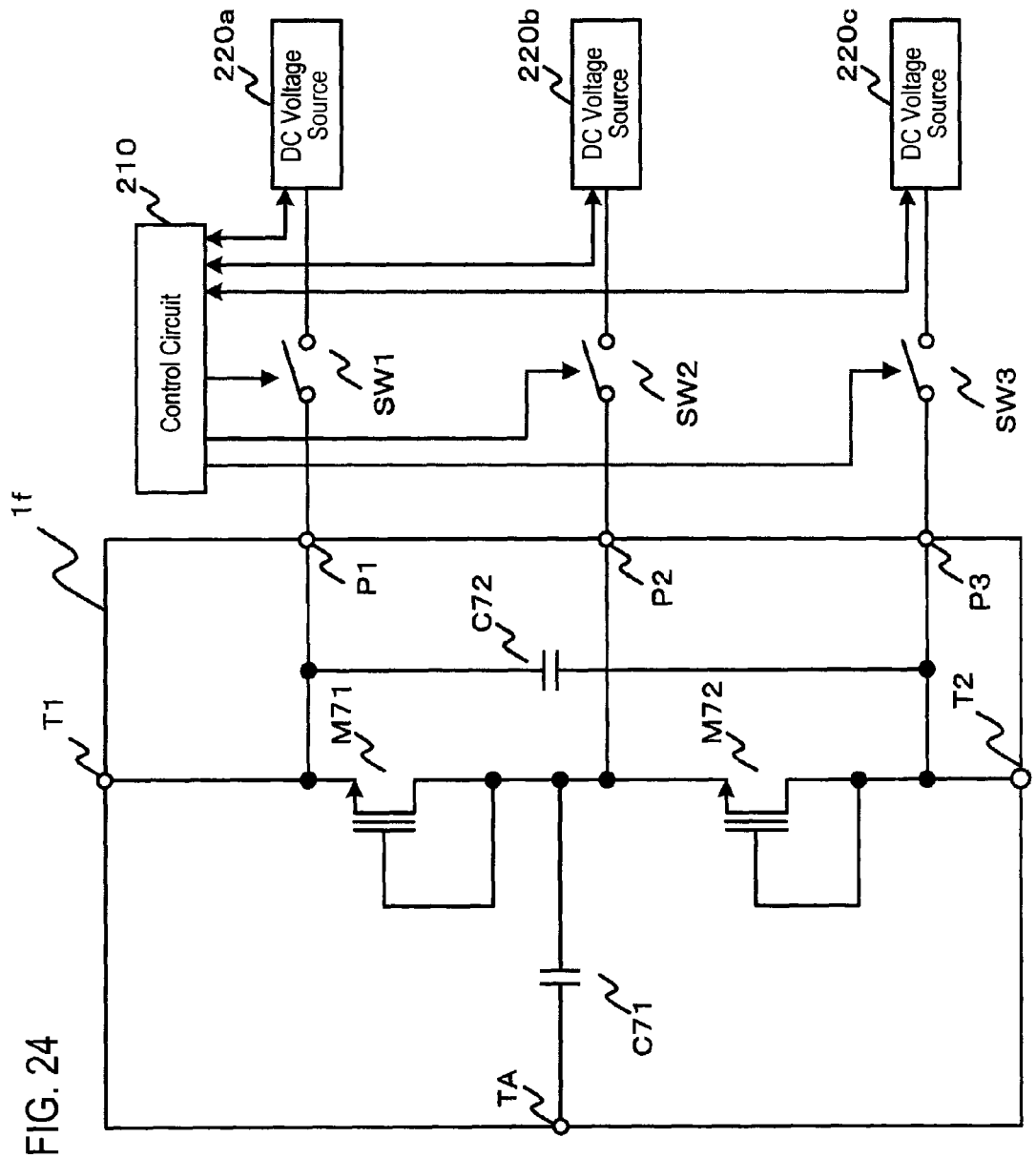
FIG. 24 is a circuit diagram of a rectification circuit according to a sixth embodiment.

A rectification circuit 1f according to a sixth embodiment is a modification of the rectification circuit 1e according to the fifth embodiment. In the rectification circuit 1f, the switches SW1 to SW3, the control circuit 210, and the DC voltage sources 220a to 220c are provided as external devices. FIG. 24 is a circuit diagram of the rectification circuit 1f according to the sixth embodiment. Components in FIG. 24 that are similar to those in FIG. 16 are given the same reference symbols as those in FIG. 24 and will not be described in detail below.

Among the components of the rectification circuit 1e of FIG. 16, the rectification circuit 1f only includes the floating gate tunnel FETs M71 and M72 and the capacitors C71 and C72. The rectification circuit 1f is provided as an IC chip, and has an electrode pad P1 which is connected to the source terminal of the floating gate tunnel FET M71, an electrode pad P2 which is connected to the source terminal of the floating gate tunnel FET M72, and an electrode pad P3 which is connected to the drain terminal of the floating gate tunnel FET M72. The electrode pads P1 to P3 can be connected to one ends of the switches SW1 to SW3, respectively.

In the above-configured rectification circuit 1f, the above-described floating gate control process (see FIG. 19) is executed for each of the floating gate tunnel FETs M71 and M72 via the electrode pads P1 to P3, for example, only once at the time of shipment from a factory. Since the floating gate is covered with an insulator, usually, charge once stored therein is not emitted (i.e., the same state is held) for a long time. For example, a memory retention period of 10 years is assured for each memory cell, using a floating gate, of an EEPROM. Therefore, also in this embodiment, once the floating gates are charged with proper setting, the rectification circuit 1f can be used for several years with no readjustments.

That is, where the rectification circuit 1f is used in an RFID tag, once the floating gates are charged with proper setting at the time of shipment from a factory, not only can a user use it in the same manner as an ordinary RFID tag but also it enables long-distance communication.

Seventh Embodiment

A rectification circuit 1g according to a seventh embodiment is also a modification of the rectification circuit 1e according to the fifth embodiment. In the rectification circuit 1g, a capacitor is connected between the control gate terminal and the drain terminal of each of the floating gate tunnel FETs M71 and M72 and the voltages held by the capacitors can be controlled.

Figure 25:
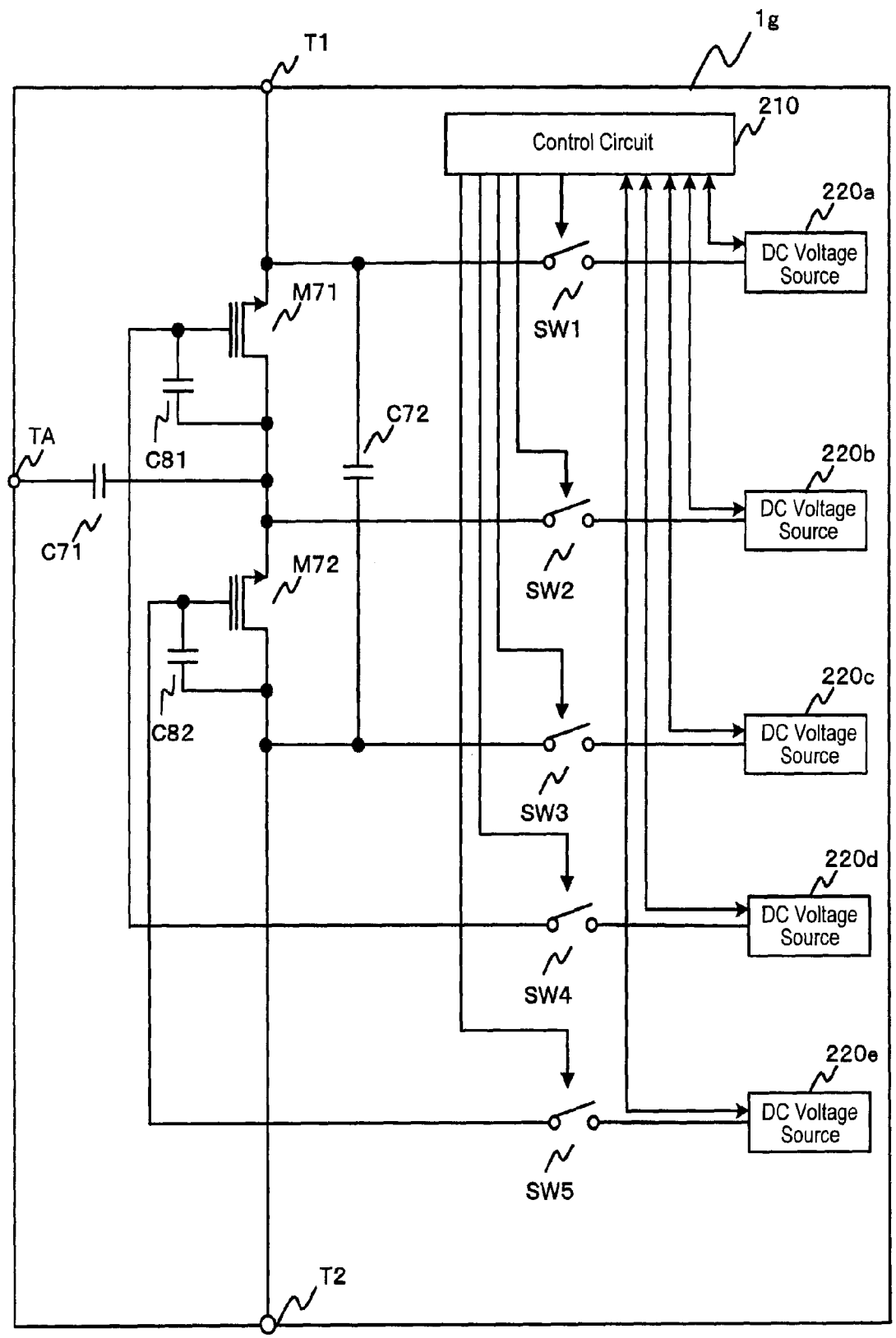
FIG. 25 is a circuit diagram of a rectification circuit according to a seventh embodiment.

FIG. 25 is a circuit diagram of the rectification circuit 1g according to the seventh embodiment. Components in FIG. 25 which are the same as those in FIG. 16 are given the same reference symbols as those in FIG. 16 and will not be described in detail. As shown in FIG. 25, the rectification circuit 1g includes, in addition to the components of the rectification circuit 1e shown in FIG. 16, a capacitor C81 which is connected between the control gate terminal and the drain terminal of the floating gate tunnel FET M71, a capacitor C82 which is connected between the control gate terminal and the drain terminal of the floating gate tunnel FET M72, and DC voltage sources 220d and 220e. Furthermore, a switch SW4 is connected between the control gate terminal of the floating gate tunnel FET M71 and the DC voltage source 220d, and a switch SW5 is connected between the control gate terminal of the floating gate tunnel FET M72 and the DC voltage source 220e. Like the other DC voltage sources 220a to 220c and switches SW1 to SW3, the DC voltage sources 220d and 220e and the switches SW4 and SW5 are controlled by the control circuit 210. Each of the DC voltage sources 220d and 220e has the same configuration as the DC voltage source 220 shown in FIG. 17.

With the above configuration, various input voltages can be applied to the control gate terminals of the floating gate tunnel FETs M71 and M72 individually. As a result, the input signal voltage that is necessary to turn on each of the floating gate tunnel FETs M71 and M72, in other words, the input signal voltage that is necessary for each of the floating gate tunnel FETs M71 and M72 to exhibit the rectification characteristic, can be adjusted to an arbitrary value.

Eighth Embodiment

Figure 26:
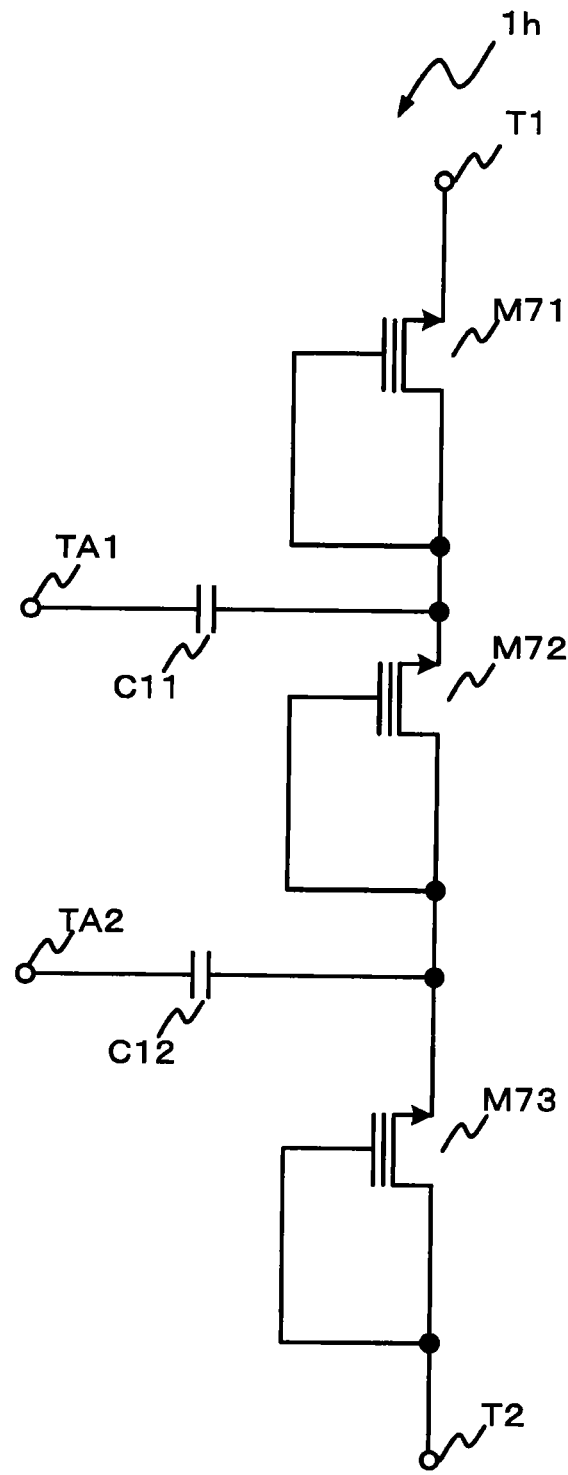
FIG. 26 is a circuit diagram of a rectification circuit according to an eighth embodiment.

FIG. 26 is a circuit diagram of a rectification circuit 1h according to an eighth embodiment. Each of floating gate tunnel FETs M71, M72, and M73 used in this embodiment is the same as each of the floating gate tunnel FETs M71 and M72 which have been described in the fifth embodiment. The source electrode of the floating gate tunnel FET M71 is connected to a positive terminal T1. The source electrode of the floating gate tunnel FET M72 is connected to the drain electrode of the floating gate tunnel FET M71. The source electrode of the floating gate tunnel FET M73 is connected to the drain electrode of the floating gate tunnel FET M72. The drain electrode of the floating gate tunnel FET M73 is connected to a negative terminal T2. The gate electrodes of the floating gate tunnel FETs M71, M72, and M73 are connected to their respective drain electrodes. Differential AC signals are input to input terminals TA1 and TA2. The input differential signals are supplied to the source electrodes of the floating gate tunnel FETs M71 and M72 via the capacitors C11 and C12, respectively. A signal that is two times as large in amplitude as that in the case of the rectification circuit 1e according to the fifth embodiment is input to the rectification circuit 1h and hence, the rectification efficiency and the sensitivity can be enhanced as compared with the fifth embodiment. In this embodiment, plural rectification circuits 1h may be connected to each other in the vertical direction as viewed in FIG. 26. That is, the same circuit as the rectification circuit 1h may be connected to the positive terminal T1 or the negative terminal T2 of the rectification circuit 1h shown in FIG. 26.

Ninth Embodiment

Figure 27:
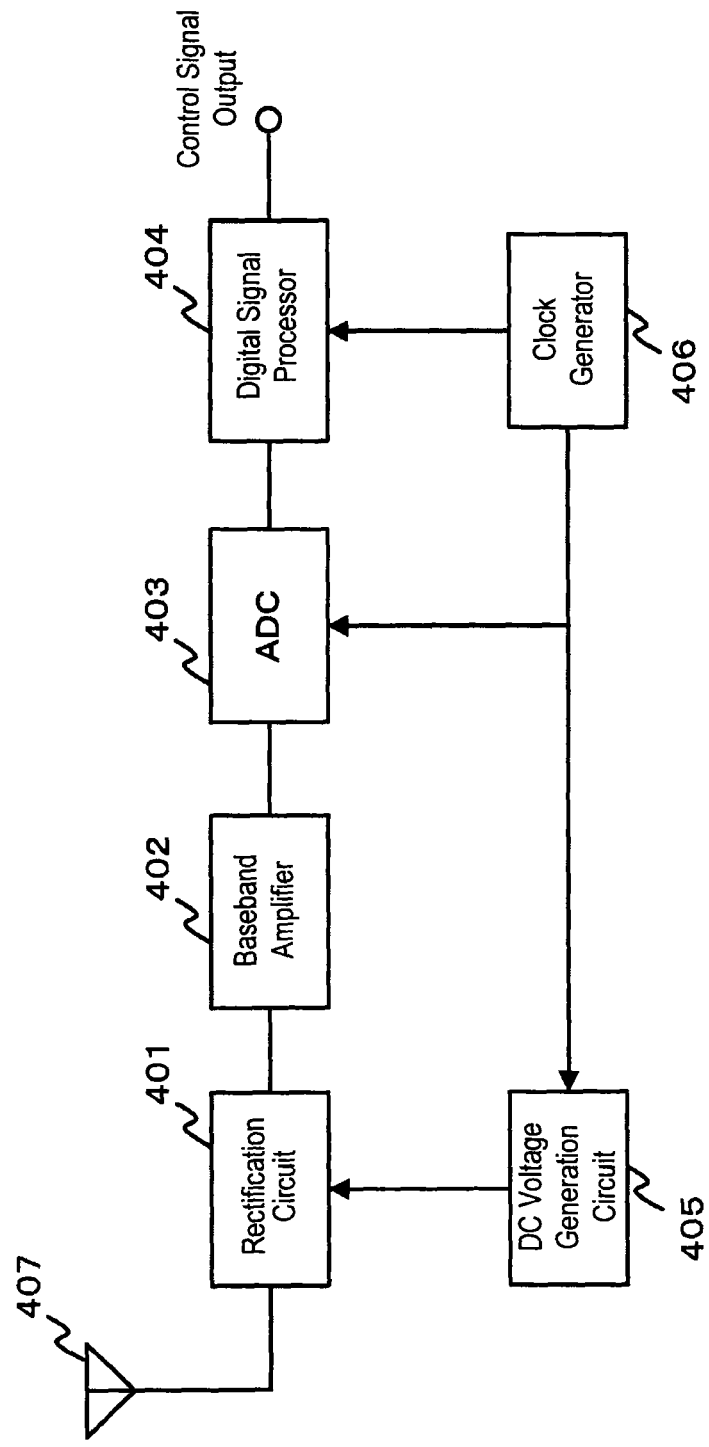
FIG. 27 is a block diagram of a radio receiving apparatus according to a ninth embodiment.

FIG. 27 is a block diagram of a radio receiving apparatus which includes one of the rectification circuits according to the first to eighth embodiments. This radio receiving apparatus includes a rectification circuit 401, a baseband amplifier 402, an ADC (analog-to-digital converter) 403, a digital signal processor 404, a DC voltage generation circuit 405, a clock generator 406, and an antenna 407. The rectification circuit 401 is one of the rectification circuits according to the first to eighth embodiments. For example, the DC voltage generation circuit 405 corresponds to the DC voltage generation circuit 110 shown in FIG. 4. The rectification circuit 401 performs squared detection for a signal that is input from the antenna 407 to thereby output its envelope as a baseband signal. The baseband amplifier 402 amplifies the received baseband signal. The ADC 403, which operates based on a clock signal that is output from the clock generator 406, converts the received signal into a digital signal. The digital signal processor 404, which operates based on a clock signal that is output from the clock generator 406, extracts such data as an ID from the received signal and outputs a control signal if the extracted data matches a prescribed signal.

Where the rectification circuit 401 is configured using a tunnel FET(s) as in the first to fourth embodiments, CMOS circuits, rather than tunnel FETs, are used in the baseband amplifier 402, the ADC 403, the digital signal processor 404, the DC voltage generation circuit 405, and the clock generator 406.

Tenth Embodiment

Figure 28:
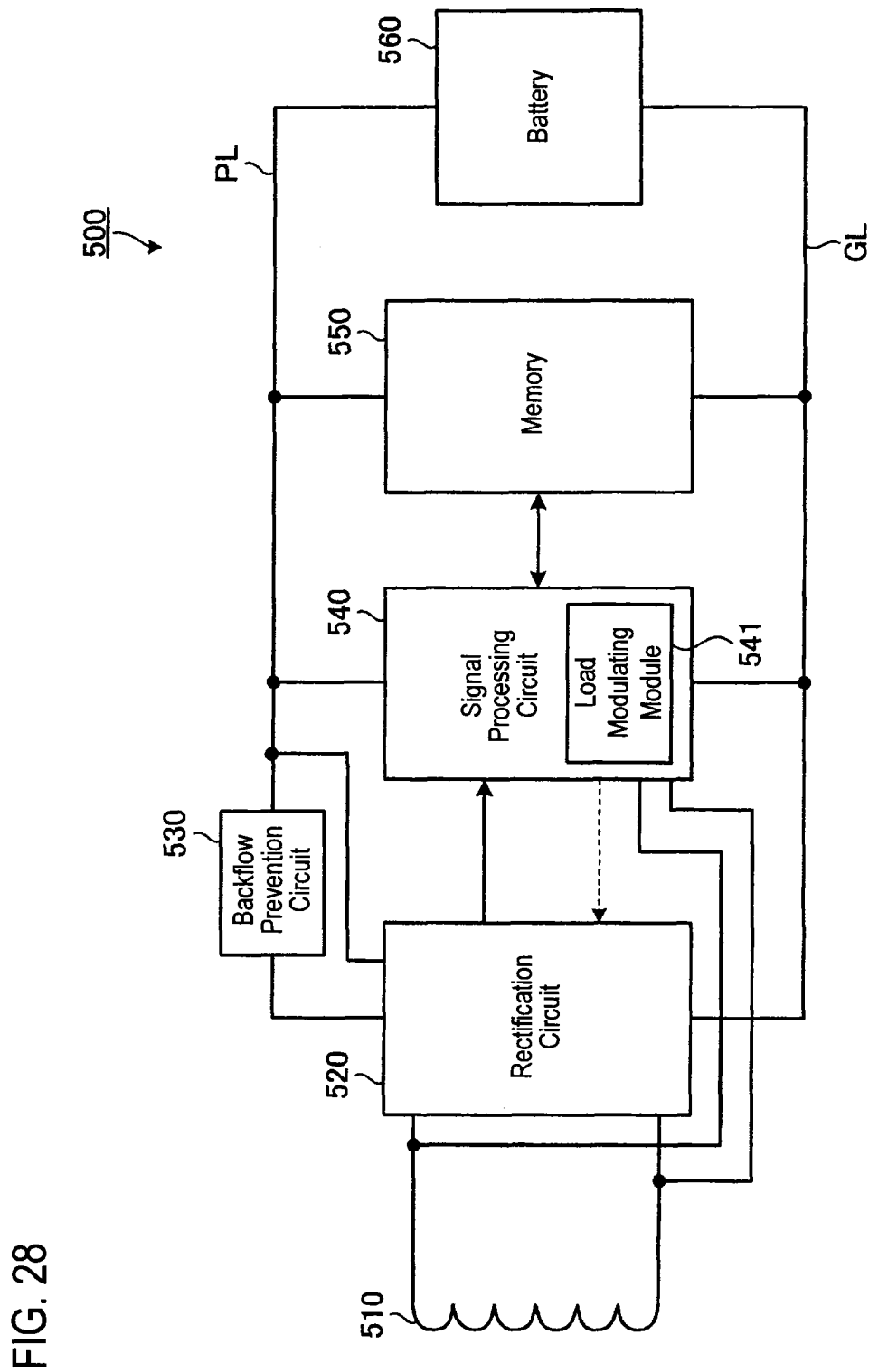
FIG. 28 is a block diagram of an RFID tag according to a tenth embodiment.

FIG. 28 is a block diagram of an RFID tag 500 which is configured using one of the rectification circuits according to the first to eighth embodiments. As shown in FIG. 28, the RFID tag 500 includes a rectification circuit 520 having the same configuration as one of the rectification circuits according to the first to eighth embodiments, a backflow prevention circuit 530, a signal processing circuit 540, a memory 550, and a battery 560 which is a secondary battery. In particular, the RFID tag 500 is an RFID tag that is driven by a power source voltage of the battery 560, and generation of a power voltage by the rectification circuit 520 is not essential for its operation. That is, each of the rectification circuit 520, the backflow prevention circuit 530, the signal processing circuit 540, and the memory 550 is connected to a power line PL and a ground line GL which extend from the battery 560.

A loop antenna 510 induces an AC current in its antenna line according to a magnetic flux variation that is given by a reader/writer (not shown). The induced AC current is input to signal input terminals of the rectification circuit 520. The rectification circuit 520 is driven by the power voltage that is supplied from the battery 560. The DC voltage generation circuit(s) in the rectification circuit 520 is driven by the power voltage supplied from the battery 560 and generates a desired DC voltage using the power voltage thus supplied. That is, the above diode bias voltage is always applied between the gate and the drain of each tunnel FET that constitutes the diode circuit, irrespective of whether or not the rectification circuit 520 receives an AC current from the loop antenna 510. Alternatively, the diode bias voltage may be applied in response to an external trigger. Therefore, as described in the first to fifth embodiments, the rectification circuit 520 can rectify a faint AC voltage having as small an effective value as about 0.7 V that is induced by the loop antenna 510. That is, a faint data signal received by the loop antenna 510 can be demodulated. The demodulated data signal is input to the signal processing circuit 540. A DC voltage obtained by the rectification circuit 520 is also supplied, in the form of charging power, to the battery 560 via the backflow prevention circuit 530.

Based on the data signal received from the rectification circuit 520, the signal processing circuit 540 takes out data (a typical example is tag identification information) stored in the memory 550 or writes data into the memory 550. The signal processing circuit 540 includes a load modulating module 541 which is connected to the loop antenna 510. Data that has been taken out of the memory 550 is sent to the reader/writer through modulation, by the load modulating module 541, of the current of the loop antenna 510. More specifically, the load modulating module 541 causes the loop antenna 510 to generate a reverse magnetic field, which causes a very small variation in current flowing through the antenna of the reader/writer. The very small variation is detected and recognized as a data signal by the reader/writer. The clock generation circuit 130 as shown in FIG. 5 may be provided in either the signal processing circuit 540 or the rectification circuit 520.

Figure 29:
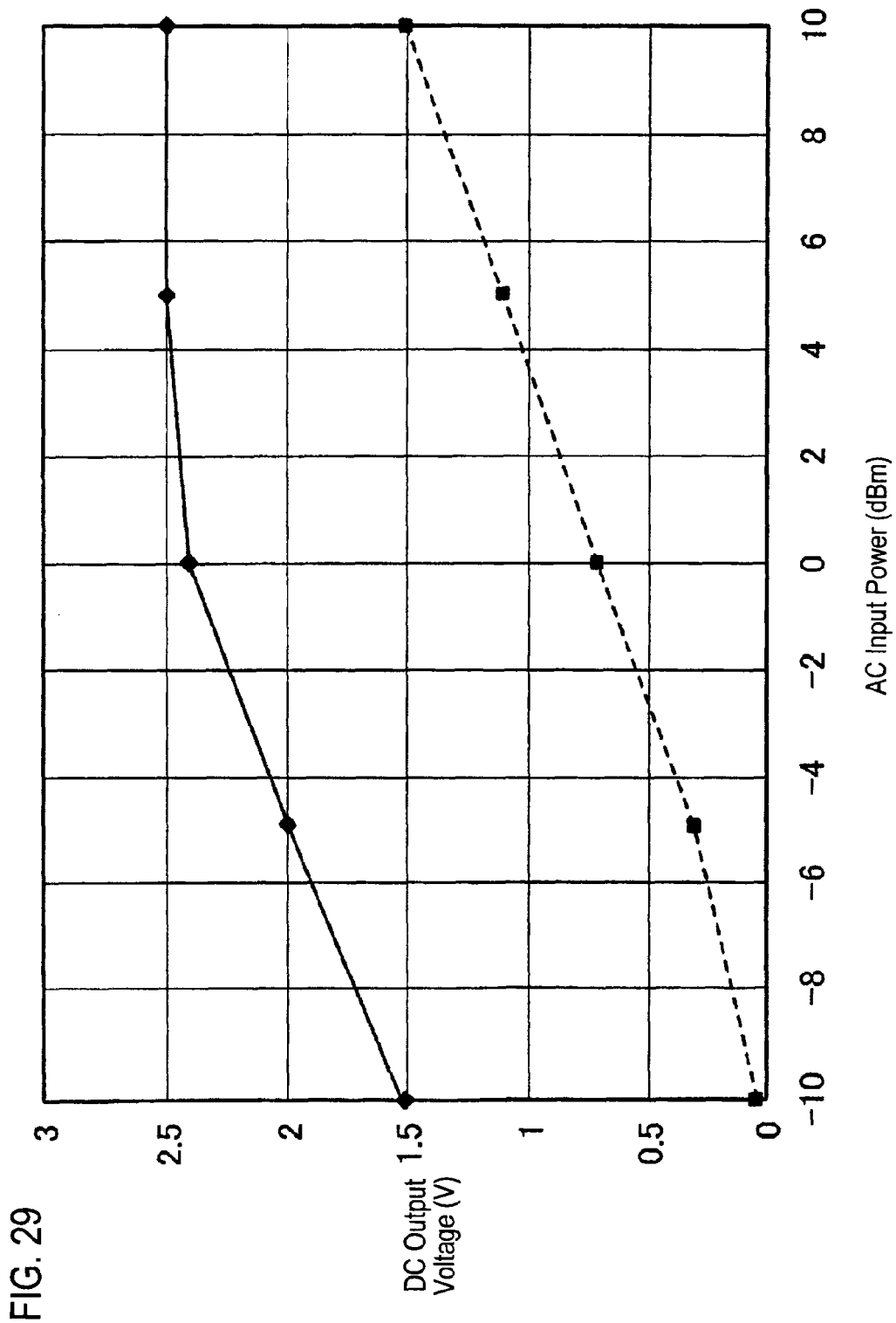
FIG. 29 is a graph showing rectification characteristic of the RFID tag according to the tenth embodiment (solid line) and an RFID tag (broken line)

FIG. 29 is a graph showing rectification characteristics of the RFID tag 500 according to the tenth embodiment (solid line) and a RFID tag of a related art (broken line). The RFID tag 500 according to the tenth embodiment can generate a DC output voltage of 1.5 V even when receiving a faint AC signal (AC input power) of −10 dBm. The signal of −10 dBm corresponds to a distance of about 10 m between the reader/writer and the RFID tag 500. The reason why in the curve of the RFID tag 500 the DC output voltage is kept constant even if the AC input power is increased beyond a certain value is due to the function of a voltage limiter that is provided inside the circuit. On the other hand, the RFID tag of the related art generates a DV voltage of as low as 0.05 V for an AC signal of −10 dBm. One skilled in the art would appreciate that under this condition, the RFID tag of the related art does not function as a rectification circuit.

As described above, since the RFID tag 500 according to the tenth embodiment incorporates the rectification circuit according to one of the first to eighth embodiments, the RFID tag 500 can recognize even a faint signal that cannot be a subject of rectification in the related art. This means a great increase in distance between the RFID tag and the reader/writer within which the RFID tag can be recognized. For example, this allows a single reader/writer to recognize, almost simultaneously, many RFID tags 500 that are distributed in a range of from several tens of meters to several hundreds of meters. This makes it possible to manage domestic animals put to pasture by attaching RFID tags 500 to them or prevent a little children or a wandering elderly person from being lost by giving an RFID tag 500 to him or her.

Figure 30:
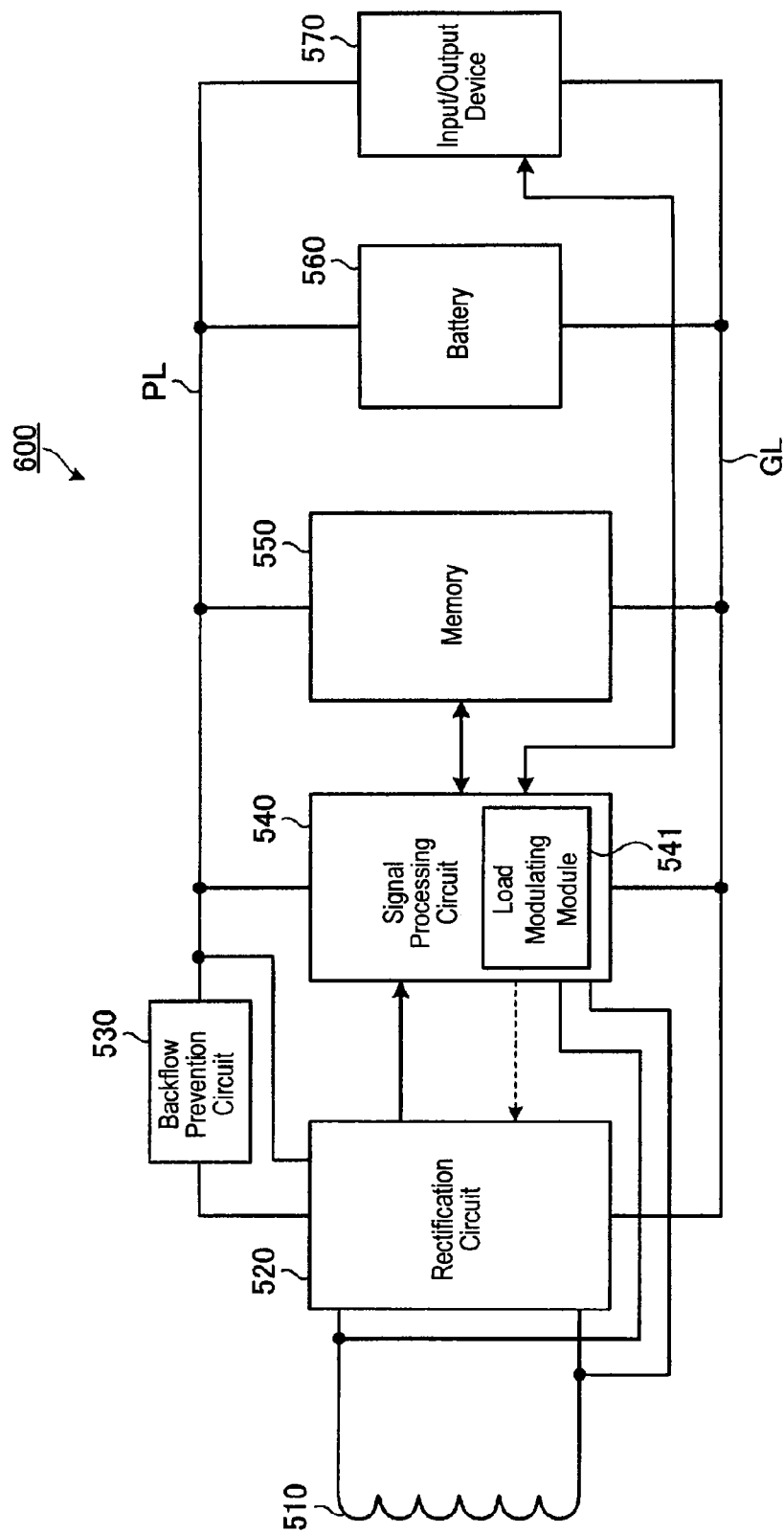
FIG. 30 is a block diagram of another RFID tag according to the 10th embodiment which incorporates an input/output device.

Since the RFID tag 500 includes the battery 560, any of various kinds of input/output devices such as a temperature sensor, a speaker, a microphone, and a light-emitting device can easily be incorporated therein. The application fields of the RFID tag 500 can thus be expanded further. FIG. 30 shows the configuration of an RFID tag 600 which incorporates an input/output device 570 which is, for example, a sensor. In FIG. 30, the same components as those in FIG. 28 are given the same reference symbols as those in FIG. 28. A power system of the input/output device 570 is connected to the PL line and the GL line which extend from the battery 560. Signal exchange with the input/output device 570 is performed by the signal processing circuit 540. Description will be given on the RFID tag 600 which incorporates a temperature sensor as an example of the input/output device 570. While no signal is transmitted from a reader/writer (not shown), the temperature sensor is in a sleep state and consumes no current. When a signal is transmitted from the reader/writer and the RFID tag 600 is thereby instructed to send out a signal, the temperature sensor is activated, detects a temperature, and sends resulting data to the signal processing circuit 540. The RFID tag 600 returns, to the reader/writer, signal data that is a combination of the temperature data and data specific to the RFID tag 600. Another implementation example with use of the temperature sensor is as follows. The signal processing circuit 540 instructs the temperature sensor to output temperature data every prescribed time, and resulting data that are output from the temperature sensor are stored in the memory 550. When receiving a command from the reader/writer, the RFID tag 600 sends out the stored temperature data together with recording time data. Also, another method for activating the temperature sensor is that it is activated when receiving stimulus in the form of vibration, sound, light, or the like. Resulting data is stored in the memory 550.

Although a certain number of embodiments have been described above, they are just examples and should not be construed as limiting the scope of the invention. Each of these novel embodiments may be practiced in various other forms. Part of each of these novel embodiments may be omitted, replaced by another element(s), or changed in various manners without departing from the spirit and scope of the invention. These modifications are also included in the invention as claimed and its equivalents.

What is claimed is:

1. A rectification circuit comprising:
a first field-effect transistor including
a first gate terminal,
a first source terminal,
a first source region having a first p-type diffusion layer and connected to the first source terminal,
a first drain terminal, and
a first drain region having a first n-type diffusion layer and connected to the first drain terminal;
a bias voltage generation circuit configured to apply a DC voltage between the first gate terminal and the first drain terminal.

2. The rectification circuit of claim 1, wherein
the first source terminal is connected to a positive terminal of the rectification circuit, and
the first drain terminal is connected to a negative terminal of the rectification circuit.

3. The rectification circuit of claim 1, wherein
an AC input voltage is input to the first drain terminal, and
a DC current is output from the first source terminal.

4. The rectification circuit of claim 1, wherein the DC voltage, which is applied between the first gate terminal and the first drain terminal by the bias voltage generation circuit, is variable.

5. A wireless communication apparatus comprising:
the rectification circuit of claim 1;
an antenna configured to input a signal to the rectification circuit;
a baseband circuit configured to amplify a signal that is output from the rectification circuit;
an analog-to-digital converter configured to convert a signal that is output from the baseband circuit into a digital signal; and
a signal processor configured to distinguish the digital signal, which is output from the analog-to-digital converter, and to output a control signal if the digital signal matches a prescribed signal.

6. The rectification circuit of claim 1, further comprising:
a first capacitor to which a first AC input voltage is input, the first drain terminal being connected to the first capacitor; and
a second field-effect transistor including
a second gate terminal,
a second source terminal connected to first capacitor,
a second source region having a second p-type diffusion layer and connected to the second source terminal,
a second drain terminal, and
a second drain region having a second n-type diffusion layer and connected to the second drain terminal, wherein
the bias voltage generation circuit is configured to further apply the DC voltage between the second gate terminal and the second drain terminal.

7. The rectification circuit of claim 6, wherein the DC voltage, which is applied by the bias voltage generation circuit between the first gate terminal and the first drain terminal and between the second gate terminal and the second drain terminal, is variable.

8. A wireless communication apparatus comprising:
the rectification circuit of claim 6;
an antenna configured to input a signal to the rectification circuit;
a baseband circuit configured to amplify a signal that is output from the rectification circuit;
an analog-to-digital converter configured to convert a signal that is output from the baseband circuit into a digital signal; and
a signal processor configured to distinguish the digital signal, which is output from the analog-to-digital converter, and to output a control signal if the digital signal matches a prescribed signal.

9. The rectification circuit of claim 1, further comprising:
a first capacitor, the first drain terminal being connected to the first capacitor;
a second capacitor, signals input to the first and second capacitors being different from each other;
a second field-effect transistor includes
a second gate terminal,
a second source terminal connected to the first capacitor,
a second source region having a second p-type diffusion layer and connected to the second source terminal,
a second drain terminal connected to the second capacitor, and a second drain region having a second n-type diffusion layer and connected to the second drain terminal,
a third field-effect transistor including
a third gate terminal,
a third source terminal connected to the second capacitor,
a third source region having a third p-type diffusion layer and connected to the third source terminal,
a third drain terminal, and
a third drain region having a third n-type diffusion layer and connected to the third drain terminal, wherein
the bias voltage generation circuit is configured to further apply the DC voltage between the second gate terminal and the second drain terminal and between the third gate terminal and the third drain terminal.

10. The rectification circuit of claim 9, wherein the DC voltage, which is applied by the bias voltage generation circuit between the first gate terminal and the first drain terminal, between the second gate terminal and the second drain terminal, and between the third gate terminal and the third drain terminal, is variable.

11. A wireless communication apparatus comprising:
the rectification circuit of claim 9;
an antenna configured to input a signal to the rectification circuit;
a baseband circuit configured to amplify a signal that is output from the rectification circuit;
an analog-to-digital converter configured to convert a signal that is output from the baseband circuit into a digital signal; and
a signal processor configured to distinguish the digital signal, which is output from the analog-to-digital converter, and to output a control signal if the digital signal matches a prescribed signal.

12. A rectification circuit comprising:
a first capacitor to which an AC input voltage is input;
a first floating gate transistor including
a first gate terminal,
a first source terminal,
a first source region having a first p-type diffusion layer and connected to the first source terminal,
a first drain terminal connected to the first capacitor,
a first drain region having a first n-type diffusion layer and connected to the first drain terminal; and
a second floating gate transistor including
a second gate terminal,
a second source terminal connected to the first capacitor,
a second source region having a second p-type diffusion layer and connected to the second source terminal,
a second drain terminal, and
a second drain region having a second n-type diffusion layer and connected to the second drain terminal, wherein
a floating gate of each of the first floating gate transistor and the second floating gate transistor is configured to store charges injected thereinto so as to produces a DC voltage.

13. A wireless communication apparatus comprising:
the rectification circuit of claim 12;
an antenna configured to input a signal to the rectification circuit;
a baseband circuit configured to amplify a signal that is output from the rectification circuit;
an analog-to-digital converter configured to convert a signal that is output from the baseband circuit into a digital signal; and
a signal processor configured to distinguish the digital signal, which is output from the analog-to-digital converter, and to output a control signal if the digital signal matches a prescribed signal.

14. The rectification circuit of claim 12, further comprising:
a second capacitor, signals input to the first and second capacitors being different from each other, the second drain terminal being connected to the second capacitor; and
a third floating gate transistor including
a third gate terminal,
a third source terminal connected to the second capacitor,
a third source region having a third p-type diffusion layer and connected to the third source terminal,
a third drain terminal, and
a third drain region having a third n-type diffusion layer and connected to the third drain terminal, wherein
a floating gate of the third floating gate transistor is configured to store charges injected thereinto so as to produce the DC voltage.

15. A wireless communication apparatus comprising:
the rectification circuit of claim 12;
an antenna configured to input a signal to the rectification circuit;
a baseband circuit configured to amplify a signal that is output from the rectification circuit;
an analog-to-digital converter configured to convert a signal that is output from the baseband circuit into a digital signal; and
a signal processor configured to distinguish the digital signal, which is output from the analog-to-digital converter, and to output a control signal if the digital signal matches a prescribed signal.

* * * * *